(12) United States Patent
Konno et al.

(10) Patent No.: US 7,709,775 B2
(45) Date of Patent: May 4, 2010

(54) SOLID-STATE IMAGING ELEMENT, PHOTO-DETECTOR AND AUTHENTICATION SYSTEM USING THE PHOTO-DETECTOR

(75) Inventors: Yasutaka Konno, Saitama (JP); Hironori Ueki, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 103 days.

(21) Appl. No.: 11/955,882

(22) Filed: Dec. 13, 2007

(65) Prior Publication Data
US 2008/0142686 A1 Jun. 19, 2008

(30) Foreign Application Priority Data
Dec. 15, 2006 (JP) ............... 2006-338489

(51) Int. Cl.
G06K 5/00 (2006.01)
H01L 27/00 (2006.01)

(52) U.S. Cl. .................. 250/208.1; 250/556

(58) Field of Classification Search ......... 250/555–557, 250/271, 221, 208.1; 382/115–127; 356/71, 356/73; 283/68, 69; 396/14, 15; 340/5.51–5.53, 340/5.8–5.83; 438/57–98; 257/414, 428, 257/431–466, 59, 72
See application file for complete search history.

(56) References Cited

U.S. PATENT DOCUMENTS 5,500,055 A 3/1996 Toyama et al.
6,252,157 B1* 6/2001 Nishio .................. 136/257
2004/0184641 A1* 9/2004 Nagasaka et al. ........... 382/124
2007/0138470 A1* 6/2007 Alieu et al. ................. 257/59

FOREIGN PATENT DOCUMENTS

| JP | 05-218469 | 8/1993 |
| JP | 2001-100389 | 4/2001 |
| JP | 2004-247686 | 9/2004 |

* cited by examiner

Primary Examiner—Georgia Y Epps
Assistant Examiner—Pascal M Bui-Pho
(74) Attorney, Agent, or Firm—Antonelli, Terry, Stout & Kraus, LLP.

(57) ABSTRACT

In a solid-state imaging element, reflecting layers are provided on both sides of a photoelectric conversion means, a light entrance window 128 is provided in the first reflecting layer 121 disposed on the photon incidence side, and a concentration means 122 is provided at a position corresponding to the window. Further, a transparent layer 136 is provided between the photoelectric conversion means and a second reflecting layer 120. A structure where photons that entered between the two reflecting layers do not flow outside is preferably employed as the shape of the second reflecting layer 120. According to the present invention, detection sensitivity of a solid-state imaging element and a photo-detector using the same is improved, and a personal authentication system carrying a photo-detector showing improved detection sensitivity is provided.

21 Claims, 21 Drawing Sheets

Structure 1

Structure 2

Structure 3

SOLID-STATE IMAGING ELEMENT, PHOTO-DETECTOR AND AUTHENTICATION SYSTEM USING THE PHOTO-DETECTOR

CLAIM OF PRIORITY

The present application claims priority from Japanese application JP2006-338489 filed on Dec. 15, 2006, the content of which is hereby incorporated by reference into this application.

BACKGROUND OF THE INVENTION

1. Technical Field

The present invention relates to a photoelectric conversion element formed with a thin film of a photoelectric absorption material such as polysilicon film or amorphous silicon film, a solid-state imaging element or detector such as image sensor, solar cell and X-ray flat panel sensor, and a system such as liquid crystal display, biometric personal authentication system, photovoltaic power generation system, X-ray imaging system and digital camera using the same.

2. Background Art

In photo-detectors for visible light, crystalline silicon has mainly been used so far to date. However, use of thin-film sensors using amorphous silicon or polysilicon is spreading in recent years.

Amorphous silicon films are also used in, besides photo-detectors, solar cells, X-ray flat panels and so forth. They can be formed as a semiconductor layer only for a necessary part on a substrate, which is formed with a relatively inexpensive material such as glass and plastics. It is easy to obtain such films of larger area, and the manufacturing process thereof is also relatively easy. Therefore, they have an advantage that they can be made more inexpensive compared with those consisting of single crystal or polycrystal silicon. However, they have a problem that the detection efficiency and efficiency for conversion into electric signals are lower than those of crystalline silicon. Moreover, crystalline silicon shows the peak sensitivity at a wavelength of around 800 nm in the near-infrared region and shows sensitivity up to around 1100 nm, whereas amorphous silicon shows the peak sensitivity at around 600 nm. Therefore, amorphous silicon shows low sensitivity especially for light of the near-infrared region. Accordingly, such a characteristic poses a problem when amorphous silicon is used for a photo-detector for that wavelength.

If it is attempted to solve this problem by using a thicker amorphous silicon, a high technical level is required to uniformly form a thick film, and in addition, there arise problems such as degradation of the production yield, longer lamination time and more serious difficulty in forming finer patterns, which may result in factors of higher cost.

On the other hand, polysilicon is widely used in liquid crystal displays using pixel thin film transistors. Furthermore, photo-detectors incorporated into liquid crystal displays and so forth have been developed in recent years. Such use of polysilicon as described above have an advantage that a photo-detector can be loaded together on other systems such as liquid crystal displays to make it possible to use common peripheral circuits for them, and a circuit such as amplifier can be incorporated into a sensor. However, polysilicon films have a problem that they show the peak sensitivity around the blue light region of a wavelength of 450 to 500 nm, and scarcely show sensitivity for light of from the red region to the near-infrared region. This is especially because of the thin film thickness. Polysilicon films are usually obtained by melting and solidifying amorphous films with irradiation of excimer laser light, and thickness of amorphous silicon film is limited to the thickness through which excimer laser light can penetrate. The upper limit is about 50 nm as described in, for example, Patent document 3.

As an effective method for improving detection sensitivity of these materials suffering from a limitation on use of thicker films, there is a method of returning photons not absorbed by a semiconductor layer to the semiconductor layer again by reflection with a reflecting layer provided on the side opposite to the photon incidence side to make them to be absorbed by the semiconductor layer, and a method for manufacturing an efficient reflecting layer is proposed in Patent document 1. Moreover, in order to realize unevenness of 100 nm or more effective for reflecting photons for a reflecting layer, Patent document 2 proposes a structure in which a transparent substrate is provided between a photoelectric conversion film and a reflecting layer.

Furthermore, Patent document 3 proposes a method of forming a photoelectric conversion film made of polysilicon in a concavo-convex shape so that photons should enter obliquely to cause multiple scattering in the photoelectric conversion film and thereby improve the sensitivity for visible light.

[Patent document 1] Japanese Patent Unexamined Publication (KOKAI) No. 2001-100389

[Patent document 2] Japanese Patent Unexamined Publication (KOKAI) No. 5-218469

[Patent document 3] Japanese Patent Unexamined Publication (KOKAI) No. 2004-247686

DISCLOSURE OF THE INVENTION

Summary of the Invention

However, with the structures of Patent documents 1 and 2 mentioned above, there is a case where the improvement in detection sensitivity cannot be considered sufficient. Moreover, by the method described in Patent document 3, multiple scattering can be caused only for a small part of photons in the photoelectric conversion film, and there is a case where the improvement in detection sensitivity cannot be considered sufficient.

As described above, the conventional methods have a limitation in obtaining higher sensitivity.

The present invention solves the aforementioned problem by employing, in a solid-state imaging element, a structure where reflecting layers are provided on both sides of a photoelectric conversion means, and light (photons) is efficiently entered into the photoelectric conversion means, and further employing a structure where light (photons) that entered between the two reflecting layers does not flow outside.

That is, the solid-state imaging element of the present invention comprises a photoelectric conversion means which generates electric charges upon incidence of photons, a layer substantially transparent for incident photons, a first reflecting layer and a second reflecting layer which reflect incident photons, and has a structure where the first reflecting layer and the second reflecting layer sandwich the photoelectric conversion means together with the transparent layer, and the incident photons are reflected once or more times by each of the first reflecting layer and the second reflecting layer to be introduced into the photoelectric conversion means a plurality of times.

The solid-state imaging element of the present invention comprises, for example, a photoelectric conversion layer which generates electric charges upon incidence of photons, a substantially transparent first electrode which is disposed on the photoelectric conversion layer on the photon incidence side, a substantially transparent second electrode which is disposed on the photoelectric conversion layer on the side opposite to the photon incidence side to face the first electrode and detects electric charges generated by the photoelectric conversion layer, a first reflecting layer which is disposed in contact with the first electrode on the photon incidence side and has a reflecting surface as the surface in contact with the first electrode, a second reflecting layer which is disposed on the second electrode on the side opposite to the photon incidence side and has a reflecting surface as the surface facing the second electrode, and a transparent layer or layers disposed between the first electrode and the first reflecting layer and/or between the second electrode and the second reflecting layer.

In a photo-detector comprising a plurality of the aforementioned solid-state imaging elements, photons can reciprocate between the first reflecting layer and the second reflecting layer many times. Thus, the photons can be introduced into the photoelectric conversion layer three times or more, and therefore the detection efficiency and the sensitivity of the detector or the element can be improved compared with conventional detectors or elements in which photons are introduced into the photoelectric conversion layer two times or less.

In the solid-state imaging element of the present invention, as a structure for efficiently introducing photons into the photoelectric conversion means, for example, the first reflecting layer may have a light entrance window which transmits incident photons. Further, the first reflecting layer may have a concentration means for concentrating incident photons to the light entrance window on the photon incidence side.

With these structures, photons can be introduced into the element via the light entrance window, and photons which entered into the first reflecting layer among photons reflected within the element can be reintroduced into the photoelectric conversion means. Therefore, undetectable photons can be reduced, and improvement in the detection efficiency can be realized.

Furthermore, in the solid-state imaging element provided with such a light entrance window, the first reflecting layer may also serve as one of the electrodes of the photoelectric conversion means. Absorption of photons by the electrodes of the photoelectric conversion means when the photons pass through them can be thereby suppressed, and improvement in the detection efficiency for photons can be realized.

Further, in the solid-state imaging element of the present invention, for example, at least one of the first reflecting layer and the second reflecting layer may consist of a conducting material and may be connected to a predetermined electric potential. External noises can be thereby prevented from entering into the solid-state imaging element to generate noises.

Further, by providing a transparent layer in the solid-state imaging element of the present invention, convexes or concaves or a structure effective for reflecting or scattering photons can be realized in the reflecting layer adjacent to the transparent layer. Specifically, at least a part of the reflecting surface of the second reflecting layer may have a concavo-convex or inclined surface. The concavo-convex surface of the second reflecting layer may have, for example, a sectional shape comprising multiple triangles. Alternatively, the reflecting layer may have a convex or concave having a sectional shape of isosceles triangle, of which apex locates on a perpendicular passing the center of the light entrance window.

With such a structure of the second reflecting layer as described above, such a design becomes possible that, for example, photons should be reflected by the second reflecting layer only to the reflecting surface of the first reflecting layer while avoiding the light entrance window, and thus it becomes possible to suppress escape of photons from the light entrance window. Moreover, a similar structure may also be provided for the first reflecting layer, or both the first reflecting layer and the second reflecting layer to realize the same effect. Furthermore, in a photo-detector comprising a plurality of the solid-state imaging element provided with such structures, a design for suppressing cross-talk to the adjacent solid-state imaging element becomes possible.

Further, in the solid-state imaging element of the present invention, for example, the center of the light entrance window may deviate from the center of the solid-state imaging element. The degree of freedom of design concerning the photon detection region in the photoelectric conversion means, prevention of escape of photons to the outside of the solid-state imaging element or the like can be thereby increased.

Furthermore, in the solid-state imaging element provided with such a light entrance window as described above, the first reflecting layer may have a section separated into a first region and a second region narrower than the first region by the light entrance window, and a concavo-convex or inclined surface may be formed for the second reflecting layer so that incident photons should be mainly reflected to the first region. The number of times of reflection of photons by the first reflecting layer and the second reflecting layer in the solid-state imaging element can be thereby increased to improve the detection efficiency of photons.

The photo-detector of the present invention is a photo-detector comprising a plurality of the solid-state imaging elements of the present invention described above in an array. The photo-detector of the present invention comprises, for example, a substrate, an array formed on the substrate and comprising a plurality of solid-state imaging elements, and a drive circuit for driving a plurality of the solid-state imaging elements, and having a structure where a second electrode, a photoelectric conversion layer and a first electrode are disposed in this order from the substrate side in the plurality of the solid-state imaging elements, and the plurality of the solid-state imaging elements are electrically connected at the first electrode or the second electrode, wherein a second reflecting layer having a reflecting surface as the surface facing the array is formed between the substrate and the second electrode in the array, a first reflecting layer having a light entrance window which transmits incident photons and a reflecting surface as the surface facing the array is disposed on the first electrode in the array, and a transparent layer which transmits photons is disposed between the first electrode and the first reflecting layer in the array and/or between the second electrode and the second reflecting layer in the array.

Alternatively, the photo-detector of the present invention comprises a substrate, an array formed on the substrate and comprising a plurality of solid-state imaging elements, and a drive circuit for driving a plurality of the solid-state imaging elements, and having a structure where a second electrode, a photoelectric conversion layer and a first electrode are disposed in this order from the substrate side in a plurality of the solid-state imaging elements, and a plurality of the solid-state imaging elements are electrically connected at the first electrode or the second electrode, wherein the substrate consists of a material which transmits photons, and has a second reflecting layer having a reflecting surface as the surface facing the array on the surface opposite to the surface on which the array is formed, a first reflecting layer having a reflecting surface as the surface facing the array is disposed on the first electrode in the array, and the first reflecting layer or the second reflecting layer is provided with a light entrance window which transmits incident photons.

Since each solid-state imaging element of the photo-detector of the present invention has a structure in which the transparent layer and the photoelectric conversion layer are disposed between the first reflecting layer and the second reflecting layer, photons which entered into the element can be kept for a long period of time between the first reflecting layer and the second reflecting layer, and therefore high detection efficiency can be obtained.

In particular, by providing a structure in which the transparent layer of each solid-state imaging element has a third reflecting layer which reflects photons and/or a shading layer which shades photons between the transparent layer and the transparent layer of the adjacent solid-state imaging element, it becomes possible to return photons which go to the adjacent element to the element, and thereby reduction of cross-talk to the adjacent element and improvement of the detection efficiency can be realized.

Further, by employing a structure in which a switch for on-off switching provided in each solid-state imaging element is disposed at a shaded position of the first reflecting layer at which the light entrance window is not formed, or a structure in which the switch is provided with a fourth reflecting layer which reflects photons and/or a shading layer which shades photons, precision of electric signals can be improved without generating error signals and noises, which are generated by incidence of photons on the switch. Furthermore, in this photo-detector, the provision of the switch enables reading of signals from the elements by one read-out circuit with changing the element to be read, and thus the circuit scale can be made small.

The personal authentication system of the present invention is provided with a light source which emits light having a wavelength of from visible to near-infrared region, a photo-detector which detects photons irradiated on an object from the light source and undergone at least one of reflection, transmission and internal scattering, a read-out circuit which reads signals from the photo-detector to form a digital image of biological information of the object, a memory means for storing biological information of the object beforehand, and an authentication means for performing signal processing for the digital image created by the read-out circuit to extract information and comparing the extracted information with the biological information stored by the memory means to attain personal authentication. As the photo-detector, the photo-detector of the present invention is used.

The personal authentication system of the present invention may be, for example, a personal authentication system using vein pattern for performing personal authentication on the basis of at least one of vain patterns of finger, palm of the hand and back of the hand. Further, it may also be, for example, a personal authentication system using fingerprint for performing personal authentication on the basis of fingerprint.

According to the present invention, detection sensitivity of a solid-state imaging element in which the photoelectric conversion film is manufactured with, for example, polysilicon or amorphous silicon can be improved. Moreover, in a photo-detector provided with a plurality of the solid-state imaging elements, detection efficiency for visible light or near-infrared light can be improved, and cross-talk between pixels can be reduced, which becomes more serious when higher sensitivity is desired. Furthermore, a highly precise personal authentication system comprising the solid-state imaging elements or the photo-detector can be provided.

DESCRIPTION OF NOTATIONS

Description of the Preferred Embodiments

Figure 1:
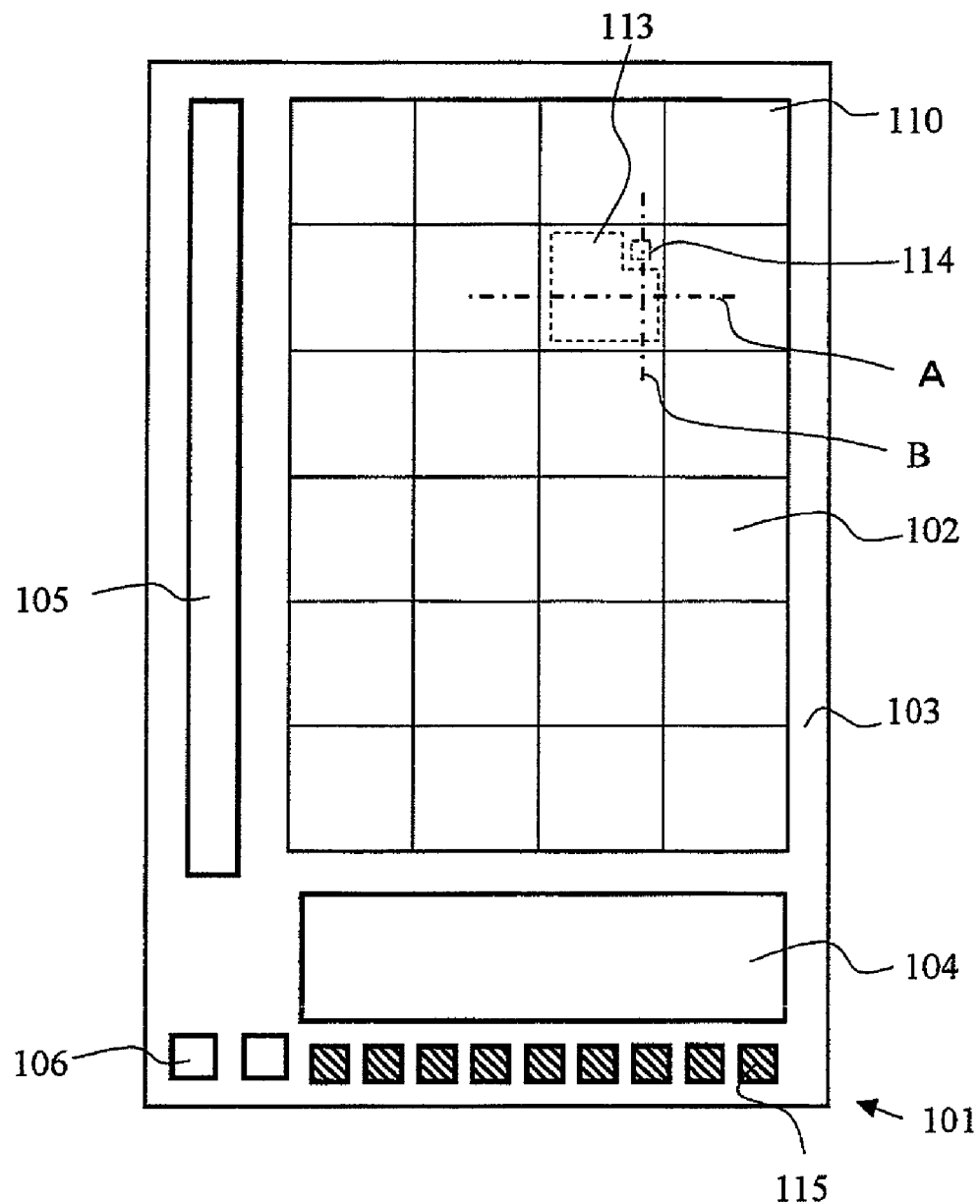
FIG. 1 shows an example of a photo-detector to which the present invention is applied.
Figure 2:
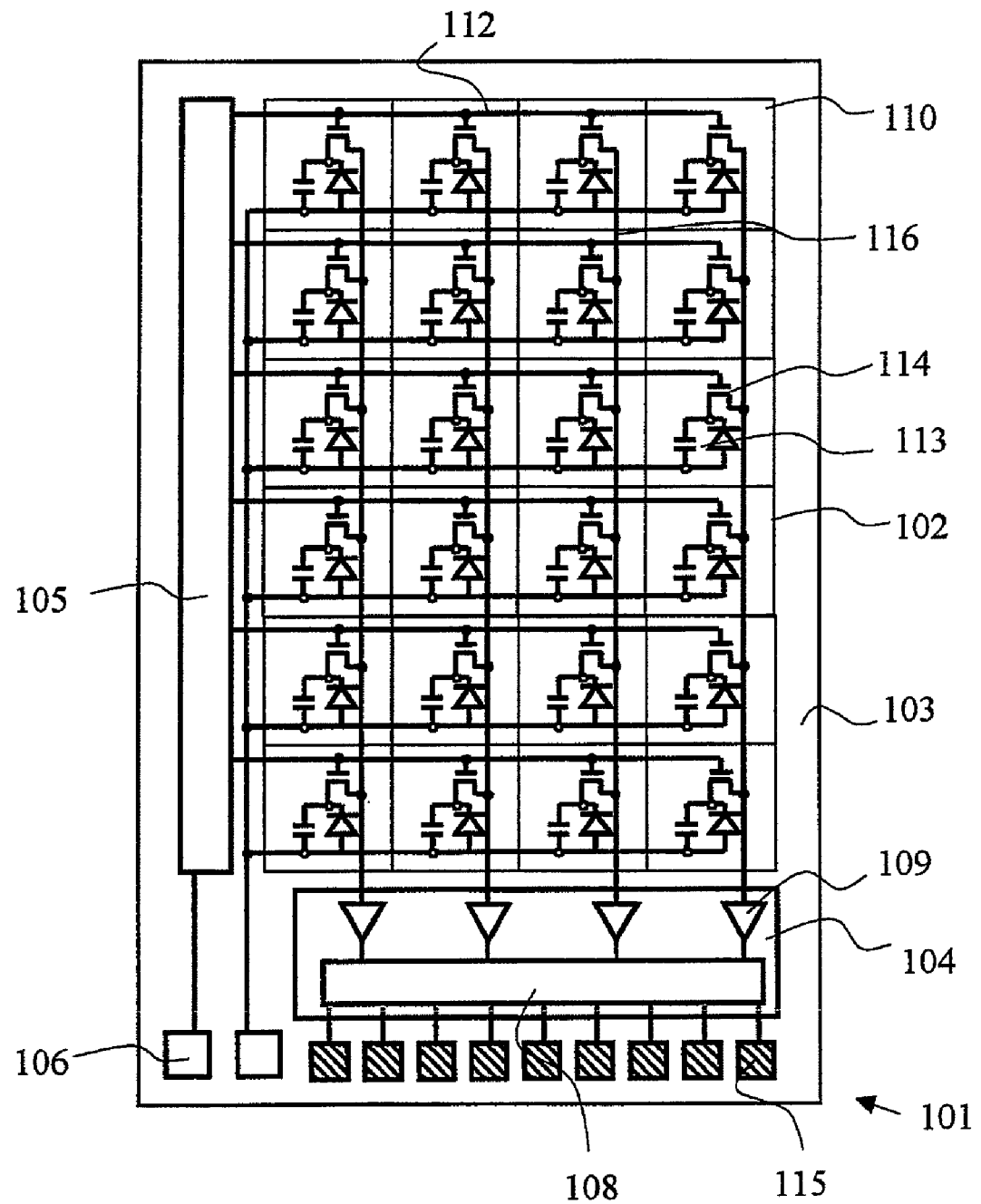
FIG. 2 shows a circuit configuration of the photo-detector of FIG. 1.

Hereafter, embodiments of the present invention will be explained. First, as an example of the photo-detector to which the present invention is applied, a photo-detector using thin-film silicon will be explained with reference to FIGS. 1 and 2. FIG. 1 is a schematic view of the photo-detector, and FIG. 2 is a circuit diagram for explaining the circuit structure of the photo-detector.

As shown in FIG. 1, the photo-detector 101 comprises a light-receiving means 102, a substrate 103, a read-out circuit 104, a shift register 105, control electrode pads 106 and output electrode pads 115. The light-receiving means 102 consists of a plurality of solid-state imaging elements 110, and each solid-state imaging element 110 is constituted by a photoelectric conversion part 113 and a switch 114 (in the drawing, the photoelectric conversion part 113 and the switch 114 are shown for only one solid-state imaging element as a representative). The configuration of the photo-detector shown in the drawing is an example of that of the photo-detector to which the present invention is applied, and the present invention is not limited to this configuration. Moreover, although relatively small numbers of solid-state imaging elements 110 and electrode pads 106 and 115 are shown in the drawing in order to simplify the explanation, the numbers of the solid-state imaging element 110 and the electrode pads 106 and 115 can also be various numbers.

The method for reading detection signals by using this photo-detector will be explained with reference to the circuit diagram of FIG. 2. Light is irradiated on the light-receiving part 102, converted into electric charge by the photoelectric conversion part 113, and accumulated as the parasitic capacitance thereof. This electric charge is read by turning on the switch 114, and a control signal for it is supplied from the shift register 105. If an on-signal goes into the control electrode pad 106, this shift register 105 turns on the switch 114 for every sequence connected with a control line 112. Therefore, as for the electric charge of the elements 110 of the same line, read-out is performed simultaneously. The electric charge read as described above reaches the read-out circuit 104 via a signal wire 116, and subjected to signal processing. In this read-out circuit 104, the electric charge is first accumulated by an integrator 109, and converted into a voltage signal. Then, the signal is sampled and held by an IC chip 108 for every sequence, and subjected to analog-to-digital conversion (A/D conversion). At this time, the A/D conversion is performed with changing the sequence one by one, and digital signals are outputted one by one from the output electrode pad 115. Then, the shift register 105 performs the same processing for another read-out line to obtain a digital signal. By performing such reading for all the lines with changing the line, signals of all the solid-state imaging elements 110 of the light-receiving part 102 can be read out.

Although a case where the capacity of the photoelectric conversion part 113 consists only of the parasitic capacitance thereof is explained above, the present invention is not limited to such a case, and capacity may be separately provided. Further, although a case where the switch is provided for every element 110 and signals are read by changing this is explained above, the present invention is not limited to such a case, and there may be various read-out schemes or circuit configurations, for example, a case where electric charge is transferred such as in CCD (Charge Coupled Device), a case where every pixel is connected to the read-out circuit without providing switches, and so forth.

The present invention relates to a structure of the solid-state imaging element (photoelectric conversion element) 110 which constitutes the photo-detector explained above. Hereafter, embodiments of the solid-state imaging element 110 of the present invention will be explained.

First Embodiment

Figure 3:
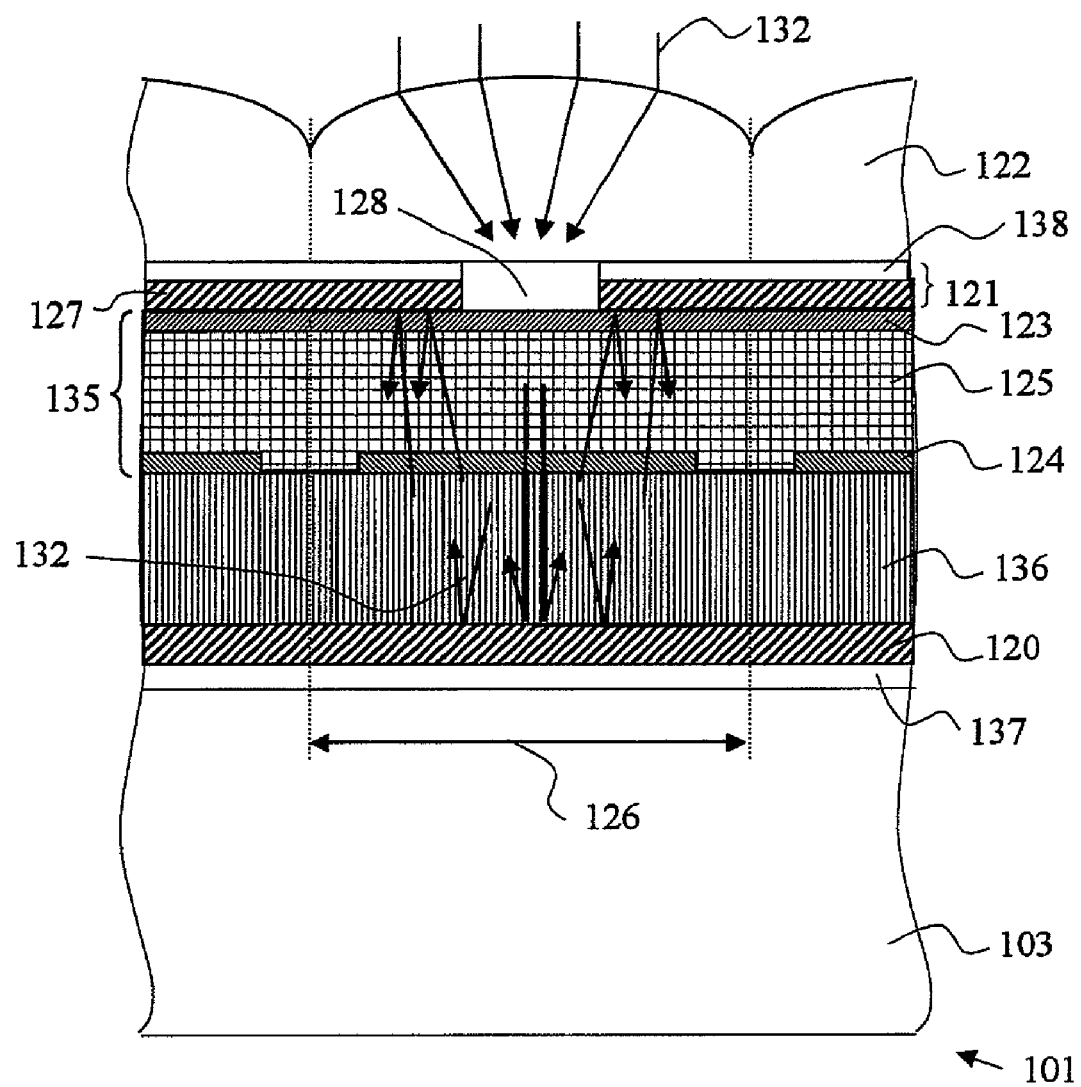
FIG. 3 shows the photo-detector of the first embodiment, and is a sectional view along the sectional line A in FIG. 1.

The structure of the solid-state imaging element 110 of the present invention according to the first embodiment is shown in FIG. 3. FIG. 3 shows a sectional view of the solid-state imaging element shown in FIG. 1 along the sectional line A. In the drawing, the upper side is the side for receiving incident photons 132, and width 126 is the width of one solid-state imaging element 110. This solid-state imaging element 110 has a structure where a reflecting layer (second reflecting layer) 120, a transparent layer 136, a photoelectric conversion element 135, a reflecting layer (first reflecting layer) 121 and a microlens 122 are formed on a substrate 103, the second reflecting layer 120 and the first reflecting layer 121 sandwich the adjacent transparent layer 136 and photoelectric conversion element 135, and further the microlens 122 is disposed on the first reflecting layer 121.

Further, in the example shown in FIG. 3, the reflecting layer 120 is adhered to the substrate 103 with adhesive 137, and the microlens 122 is adhered to a reflecting surface 127 of the reflecting layer 121 with adhesive 138.

The second reflecting layer 120 and the first reflecting layer 121 have a function of confining photons which entered into the solid-state imaging element 110 between the both, and the reflection parts which reflect photons are formed as the facing surfaces. The reflection parts consist of light reflective surfaces such as mirror surfaces, and specifically, they can be formed by forming a thin film of a metal such as aluminum and silver by deposition or the like. Alternatively, the reflecting layers 120 and 121 may be layers of a resin mixed with a white pigment. In addition, although higher reflectivity of the reflection means is more preferred, it is sufficient that they should have a reflectivity enabling reflection of 40% or more of incident photons, for example.

As for photon transmission rates of the photoelectric conversion element 135 and the transparent layer 136, if the reflection rate of the first reflecting layer 121 is represented by R1, the reflection rate of the second reflecting layer 120 is represented by R2, and transmission rate of the photoelectric conversion element and the transparent layer for transmission of photons is represented by T, $T \times T \times R1 \times R2$ is preferably 0.1 or larger. By satisfying such a requirement, effective improvement in detection sensitivity can be realized. In particular, when escape of photons from the light entrance window can be ignored, the detection sensitivity can be improved 10% or more.

Further, the light entrance window 128 through which the incident photons 132 transmit is formed in the first reflecting layer 121. It is sufficient that the light entrance window 128 should be substantially transparent, and it may be a hole (air), or may consist of a substantially transparent material. The term "substantially transparent" means to have, for example, a transmission rate of 50% or more. The light entrance window 128 may have various shapes. For example, it may be a slot along the direction perpendicular to the sectional line A indicated in FIG. 1, or it may have a round shape or polygonal shape. The width (diameter) of the light entrance window 128 is appropriately determined on the basis of the relation to width 126 of pixel, thickness of the transparent layer 136 to be explained later, and the like. For example, when the width 126 of pixel is 100 μm, it is 20 μm.

The microlens 122 is formed from convex lenses having a size suitable for the size of the solid-state imaging element 110 and arranged according to the sequence of the solid-state imaging elements 110, and it concentrates photons which entered into the solid-state imaging element 110, and leads them to the light entrance window 128.

The photoelectric conversion element 135 has a structure where a photoelectric conversion film 125 is inserted between a common electrode 123 and a pixel electrode 124, and it is disposed so that the common electrode 123 should be on the light-receiving side. The common electrode 123 and the pixel electrode 124 are formed from a substantially transparent material for the incident photons 132, such as ITO (indium tin oxide), indium oxide ($In_2O_3$), tin oxide ($SnO_2$) and zinc oxide (ZnO) films, and it has, for example, a transmission rate of 50% or more. The materials constituting the common electrode 123 and the pixel electrode 124 may be the same or different, and transmission rates thereof may also be the same or different.

The photoelectric conversion film 125 consists of a polysilicon film or an amorphous silicon film. The film thickness thereof is, for example, 50 nm in the case of a polysilicon film. In the case of an amorphous silicon film, for example, it is 500 nm.

Photons which entered into the solid-state imaging element 110 from the light entrance window 128 pass through the transparent common electrode 123, and reach the photoelectric conversion film 125, and a part of them are absorbed and cause photoelectric conversion, resulting in accumulation of electric charge corresponding to the amount of photons absorbed by each pixel electrode 124.

The transparent layer 136 is a layer which transmits photons, and is formed from a material which transmits photons, for example, glass and plastics such as acrylic resins. Further, instead of glass or plastics, only a space may be provided. That is, the transparent layer 136 may be a layer of air or vacuum. The transparent layer 136 preferably has a transmission rate of 50% or more.

By providing the transparent layer 136, the solid angle for subtending the light entrance window 128 at the second reflecting layer 120 can be made smaller. The rate of photons escaping from the light entrance window 128 among the incident photons reflected by the second reflecting layer 120 can be thereby reduced, and it thus becomes possible to increase amount of photons reciprocating in a space between the second reflecting layer 120 and the first reflecting layer 121 including the photoelectric conversion element 135 (number of reciprocation).

The thickness of the transparent layer 136 is appropriately determined on the basis to the relation to the width 126 of pixel, the size of the light entrance window 128 mentioned above, and so forth. For example, when the width 126 of pixel is 100 μm and the width of the light entrance window 128 is 20 μm, it is 100 μm.

In the aforementioned configuration, photons 132 received by the solid-state imaging element 110 are concentrated by the microlens 122, enter into the photoelectric conversion element 135 from the light entrance window 128 of the first reflecting layer 121, pass through the transparent common electrode 123, and reach the photoelectric conversion film 125, and a part of them are absorbed by the film. The photons not absorbed by the photoelectric conversion film 125 transmit the pixel electrode 124 and the transparent layer 136, and reach the second reflecting layer 120. The photons are reflected by the mirror surface of the second reflecting layer 120, pass through the transparent layer 136 again and reach the photoelectric conversion film 125, and a part of them are absorbed by the film. Further, a part of the photons which passed through the photoelectric conversion film 125 reach the reflecting surface 127 of the first reflecting layer, are reflected again, and reach the photoelectric conversion film 125, and a part of them are absorbed. Such reciprocation is repeated thereafter. Although a part of the photons escape from the light entrance window to the outside, and a part of them are absorbed by the members other than the photoelectric conversion film 125, most of the photons can be absorbed with the photoelectric conversion film 125.

During the photons which entered into the solid-state imaging element 110 are reciprocated between the second reflecting layer 120 and the first reflecting layer 121, amount of reciprocating photons (number of reciprocation) can be increased by the presence of the transparent layer 136 which makes the solid angle for subtending the light entrance window 128 at a reflecting point on the second reflecting layer 120 smaller as described above. The effect of this transparent layer 136 will be explained in detail with reference to FIG. 4.

Figure 4:
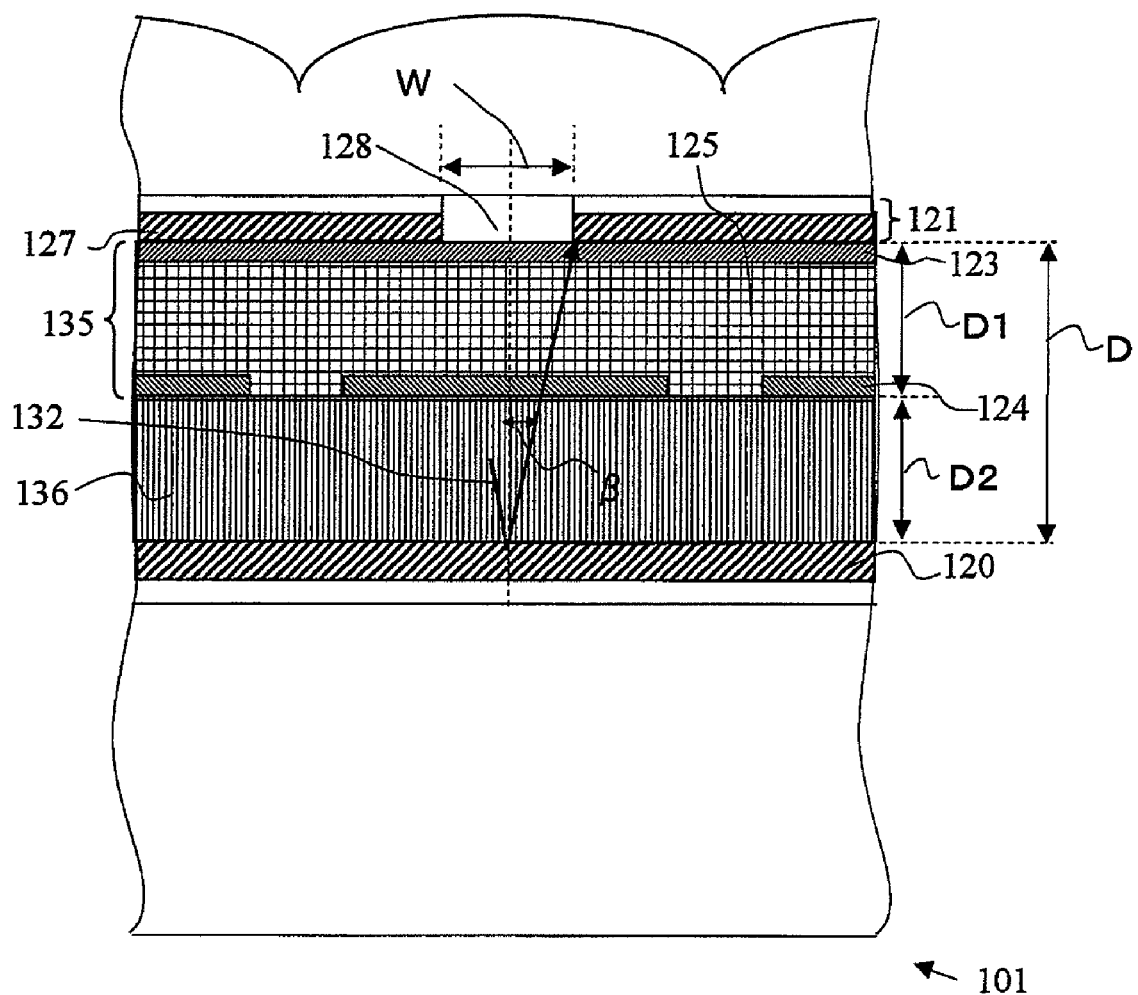
FIG. 4 is an explanatory view for explaining the effect of the transparent film 136 in the first embodiment.

As shown in FIG. 4, in order that photons 132 which entered from the light entrance window 128 and were reflected by the reflecting layer 120 can reach the reflection part 127 without escaping from the light entrance window 128, the reflection angle at the reflecting layer 120 must be larger than the angle β shown in FIG. 4. That is, photons which entered from the light entrance window 128 with an angle larger than the angle β can be kept in the solid-state imaging element 110, and a smaller angle β provides a higher ratio of photons kept in the solid-state imaging element 110. The angle β is a solid angle for subtending the light entrance window at a reflection point, and if the width of the light entrance window 128 is represented by W, and the distance between the reflecting surface 127 of the first reflecting layer 121 and the second reflecting layer 120 is represented by D, it is represented as follows: $\beta=\tan^{-1}(W/2D)$. Therefore, smaller W or larger D provides a smaller value of β. If the width of the light entrance window 128 is relatively narrow with respect to the element width 126, the amount of photons which enter into the element decreases. On the other hand, the photoelectric conversion element 135 is a thin film, and it is difficult to make it thicker. Therefore, in this embodiment, the transparent layer 136 is inserted to lengthen the distance D between the reflecting surface 127 of the first reflecting layer 121 and the second reflecting layer 120 and thereby make the visual angle small.

Specifically, when, for example, the width W of the light entrance window is 20 μm, the thickness D1 of the photoelectric conversion element 135 is 50 nm, and the thickness D2 of the transparent layer 136 is 100 μm, β is 5.7 degrees when there is the transparent layer 136, whereas it is 89.7 degrees when there is not the transparent layer 136. Therefore, when there is the transparent layer 136, most of photons which enter with an incidence angle of 0 to 90 degrees reach the reflecting surface 127 of the reflecting layer 121 without escaping from the light entrance window 128, and an opportunity is given to detect them again by the photoelectric conversion element 135. On the other hand, when there is no transparent layer 136, a major part of the incident photons escape from the light entrance window 128 to the outside, and those photons can no longer be detected. By providing the transparent layer 136 as described above, it becomes possible to confine more photons in the solid-state imaging element 110 and detect them.

If photons are introduced into the photoelectric conversion film 125 and absorbed thereby multiple times, pairs of electron and hole are generated in the photoelectric conversion film 125. Since this electric charge is dependent on the amount of incident photons, distribution of incident photon amounts can be imaged by reading the charge from the common electrode 123 and the pixel electrode 124 for every element 101.

An example of the manufacturing method of the photo-detector 101 will be explained below with reference to FIG. 5. However, the manufacturing method of the photo-detector 101 of this embodiment is not limited to this method.

Figure 5:
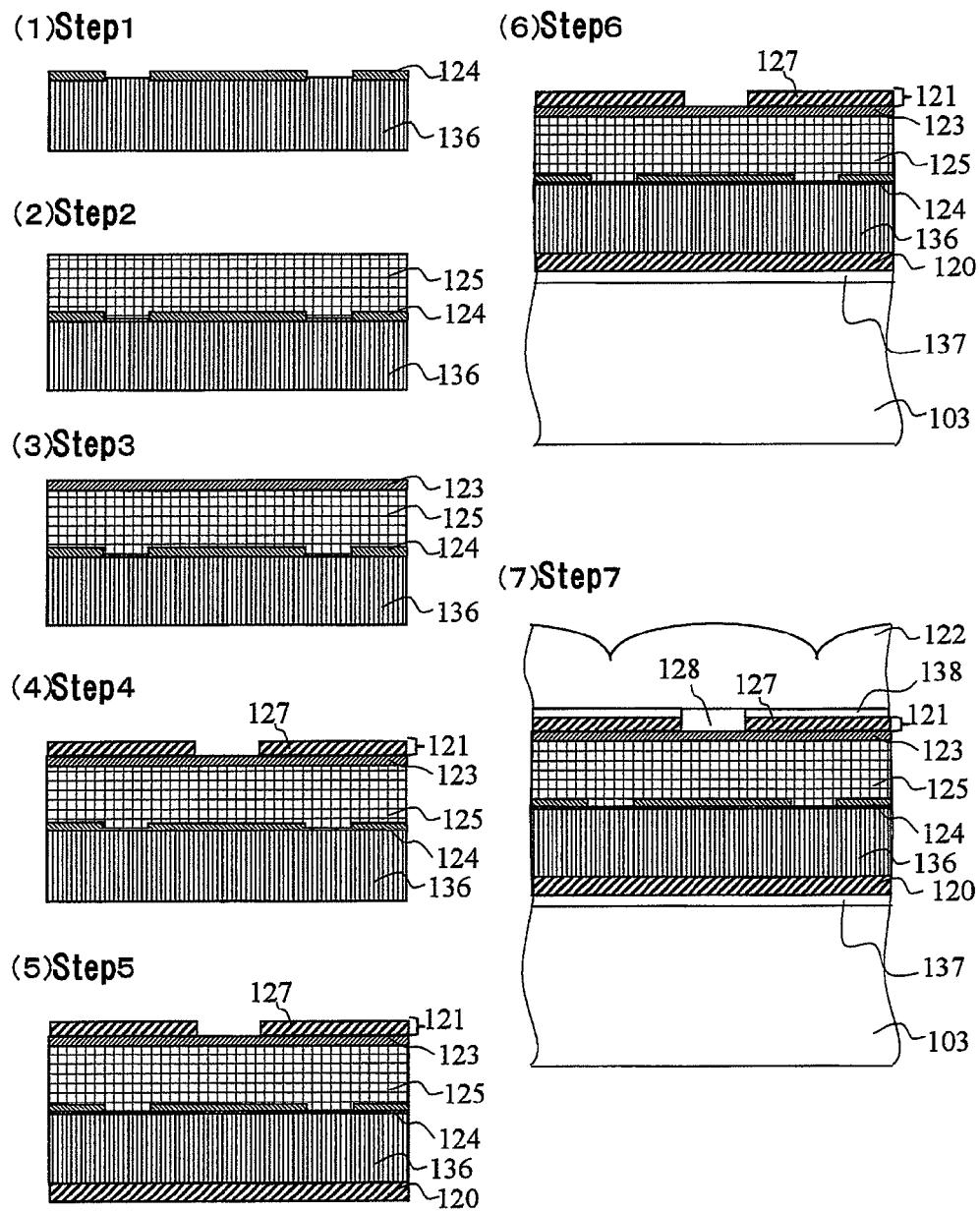
FIG. 5 is an explanatory view for explaining an example of the manufacturing steps of the photo-detector of the first embodiment.

First, as shown in Step 1 of FIG. 5, a glass plate or a plastic plate is used as the transparent layer 136, and the pixel electrode 124 is provided thereon. This pixel electrode 124 is transparent for incident photons, and consists of, for example, ITO, tin oxide, zinc oxide or the like. When ITO is used, it is manufactured by, for example, the electron-beam deposition method, the DC magnetron sputtering method or the like. When tin oxide is used, it is manufactured by, for example, the electron beam deposition method, the RF magnetron sputtering method, the DC magnetron sputtering method, the spray method, the chemical vapor deposition (CVD) method or the like. When zinc oxide is used, it is manufactured by, for example, the sol-gel method, the spray pyrolysis method, the electroless plating method, the RF magnetron sputtering method, the DC magnetron sputtering method, the CVD method, the metal-organic chemical vapor deposition (MOCVD) method, the reactive evaporation method, the pulsed laser deposition method or the like.

Then, as Step 2, the photoelectric conversion film 125 is formed thereon. This photoelectric conversion film 125 is manufactured by, for example, when polysilicon is used, the laser annealing method, the solid-phase crystallization method, the CVD method or the like. When amorphous silicon is used, it is manufactured by, for example, the glow-discharge method, the reactive sputtering method, the ion-plating method, the ionized cluster beam method or the like.

Then, in Step 3, the common electrode 123 is manufactured in the same manner as that for the pixel electrode 124. Although not shown in the steps shown in FIG. 5, a step for producing the switch 114 is performed during a period after starting Step 1 and before performing Step 4.

Then, in Step 4, the first reflecting layer 121 is formed. The reflecting layer 121 is manufactured by forming a film with a metal such as aluminum or silver by, for example, the deposition method. In this step, by covering a portion corresponding to the light entrance window 128 with a mask or the like, and removing the mask after the film formation, the light entrance window 128 is formed. Then, in Step 5, the second reflecting layer 120 is manufactured on a surface of the transparent layer 136 shown as the lower surface in the drawing. The second reflecting layer 120 can be manufactured in the same manner as that for the first reflecting layer 121. Then, in Step 6, the laminate obtained in Step 5 is adhered to the substrate 103 with adhesive 137, and in Step 7, the microlens 122 is adhered with adhesives 138 concentrically with the light entrance window 128. The photo-detector 101 thus can be manufactured.

According to this embodiment, by using a structure where the photoelectric conversion element 135 is inserted between the first and second reflecting layers 121 and 120, and providing the light entrance window 128 in the first reflecting layer 121 disposed on the photon incidence side and the transparent layer 136 of a predetermined thickness between the second reflecting layer 120 disposed on the opposite side and the photoelectric conversion element 135, photons which entered from the light entrance window 128 can be effectively confined between the first and second reflecting layers 121 and 120 to increase the amount of photons participating in photoelectric conversion by the photoelectric conversion element 135 and thereby improve the detection sensitivity.

Further, a concentration means such as the microlens 131 disposed on the photon incidence side of the light entrance window 128 enables concentration of more photons to the light entrance window 128. Although the microlens 131 is used as the concentration means in the embodiment shown in the drawings, the present invention is not limited to this, and the concentration may be attained by using other optical lenses, grid or optical fiber. Further, structures not comprising any concentration means are also fall within the scope of the present invention.

While the photo-detector of this embodiment is explained above, the materials and the structures mentioned in the aforementioned explanation are examples for the photo-detector of this embodiment, and various modifications are possible. For example, although a configuration that the second reflecting layer 120 and the transparent layer 136 are formed between the substrate 103 and the photoelectric conversion element 135 is shown in the drawings, it is also possible to employ a structure where the substrate 103 and the adhesive 137 mentioned in FIG. 3 are omitted, and the transparent layer 136 also serves as the substrate 103 which supports the photo-detector. In this case, the substrate 103 is constituted by a material which transmits photons, the photoelectric conversion element 135 is provided on one side of the substrate, and the second reflecting layer 120 is provided on the other side.

Further, in the aforementioned explanation, when the reflecting layers 120 and 121 consist of metals, it is also possible to electrically connect at least one of these to ground or electrode potential of a read-out circuit, a control circuit, a power supply or the like. By using such a structure, error signals and noises generated in output signals of the photo-detector 101 by external noises which flow in from the outside and flow into the photo-detector 101 and detected in the photoelectric conversion element 135, wiring or the like can be thereby reduced.

Further, in the aforementioned explanation, the first reflecting layer 121 and the common electrode 123 were separately provided. However, such a configuration is an example of the photo-detector of this embodiment, and the first reflecting layer 121 and the common electrode 123 may be integrated. In such a case, for example, the common electrode 123 is manufactured from a metal such as aluminum and silver, which is a material reflecting photons and previously described as the material of the first reflecting layer 121. Furthermore, the common electrode 123 has the light entrance window 128, and photons are entered into the photoelectric conversion element 135 from here. At this time, the photons can directly reach photoelectric conversion layer 125 without passing through any electrode, and therefore there is no attenuation by the first reflecting layer 121. On the other hand, even if the common electrode 123 is manufactured with a transparent electrode, for example, with ITO, transmission rate does not reach 100%. Therefore, integration of the first reflecting layer 121 and the common electrode 123 enables improvement in the detection efficiency.

Figure 6:
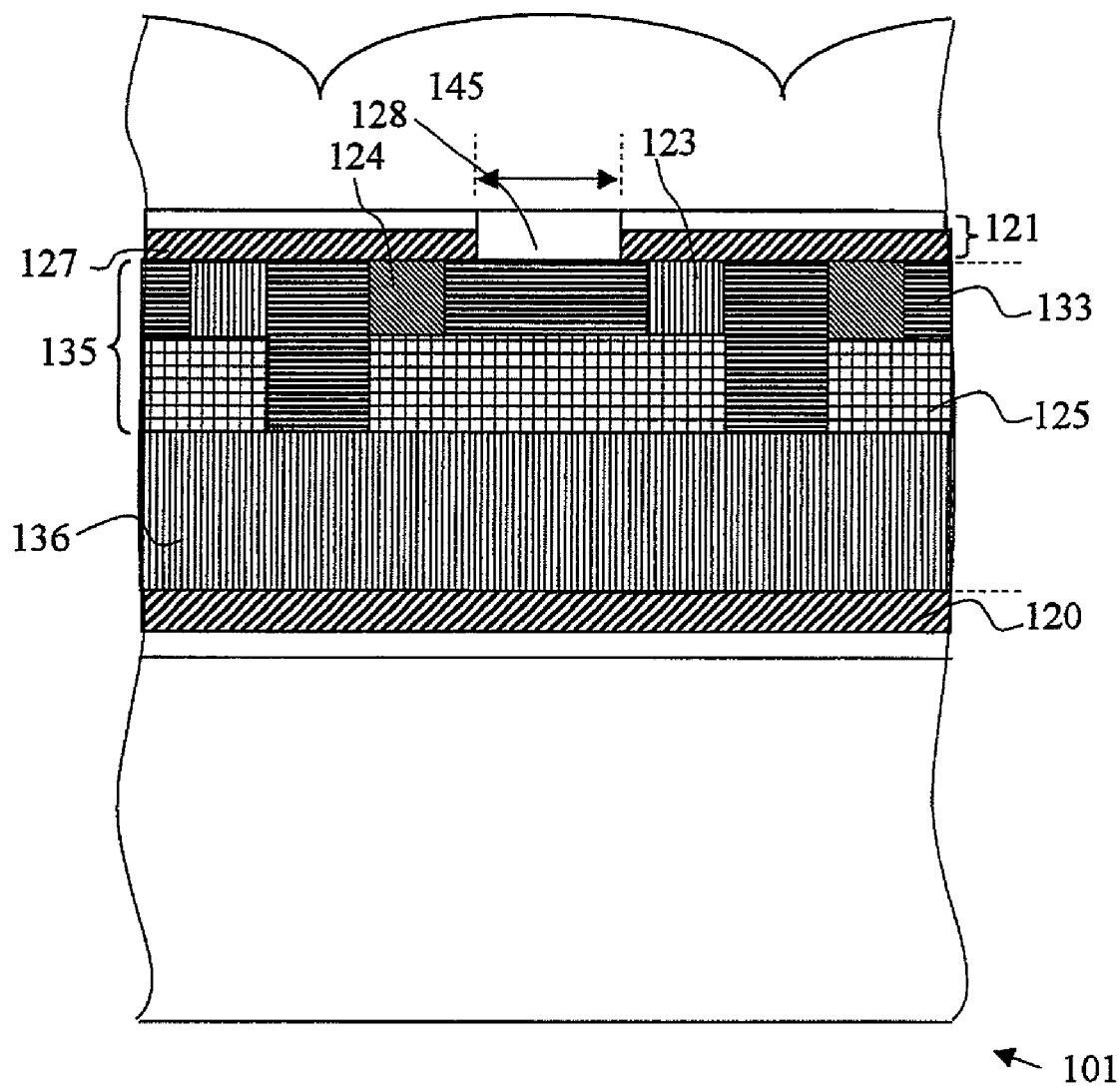
FIG. 6 is an explanatory view for explaining a photo-detector which can be applied to the first embodiment and has a structure different from that of FIG. 3.

Further, in the aforementioned explanation, the photoelectric conversion element 135 has a structure where the common electrode 123 and the pixel electrode 124 face each other. However, this is an example of the structure of the photo-detector of this embodiment, and the common electrode 123 and the pixel electrode 124 may be on the same plane as shown in FIG. 6. The photoelectric conversion element 135 shown in FIG. 6 consists of the photoelectric conversion layer 125 provided for every element 101 and an insulation layer 133 which electrically insulates the layers, and the common electrode 123 and the pixel electrode 124 are electrically connected to the right and left ends of the photoelectric conversion layer 125, respectively. The photoelectric conversion element of such a structure has a structure where photons which come along the vertical direction are detected by the photoelectric conversion layer 125, and electrons and holes generated thereby are moved along the horizontal direction for reading. The photoelectric conversion layer 125 is manufactured from, for example, amorphous silicon, and the insulation layer 133 is manufactured from, for example, silicon oxide.

Also in such a photoelectric conversion element 135, the effect similar to that mentioned above can be realized by employing the structure where the photoelectric conversion layer 125 is sandwiched together with the transparent layer 136 between the first reflecting layer 121 and the second reflecting layer 120.

Further, in the aforementioned explanation, read-out of the quantity of the electric charge generated between the photoelectric conversion elements 135 is attained by the structure where the same charge quantity is generated by an integrator 109. However, this is an example of the structure of the photo-detector of this embodiment, and there may be various structures. For example, a voltage conversion means which generates a voltage signal according to charge quantity may be provided for every pixel, and a voltage signal produced by this may be read. Further, for example, an electric charge amplifier which amplifies charge quantity may be provided, and the thus amplified charge quantity may be read.

Further, in the aforementioned explanation, there is used the structure where the common electrode 123 is adjacent to the first reflecting layer 121. However, this is a mere example of the structure of the photo-detector of this embodiment, and a structure where the pixel electrode 124 is adjacent to the first reflecting layer 121 may of course be also used.

Further, a case where the reflecting layer 121 has a flat mirror surface is explained for this embodiment. However, various modifications are possible. In order to prevent the incident photons reflected by the reflecting layer 121 from escaping from the light entrance window 128, a flat profile may not be used for the reflecting layer 121. For example, inclination may be provided, unevenness may be provided, or convexes and concaves may be provided. Hereafter, embodiments using different profiles of the reflecting layer 121 will be explained as the second to sixth embodiments.

Second Embodiment

Figure 7:
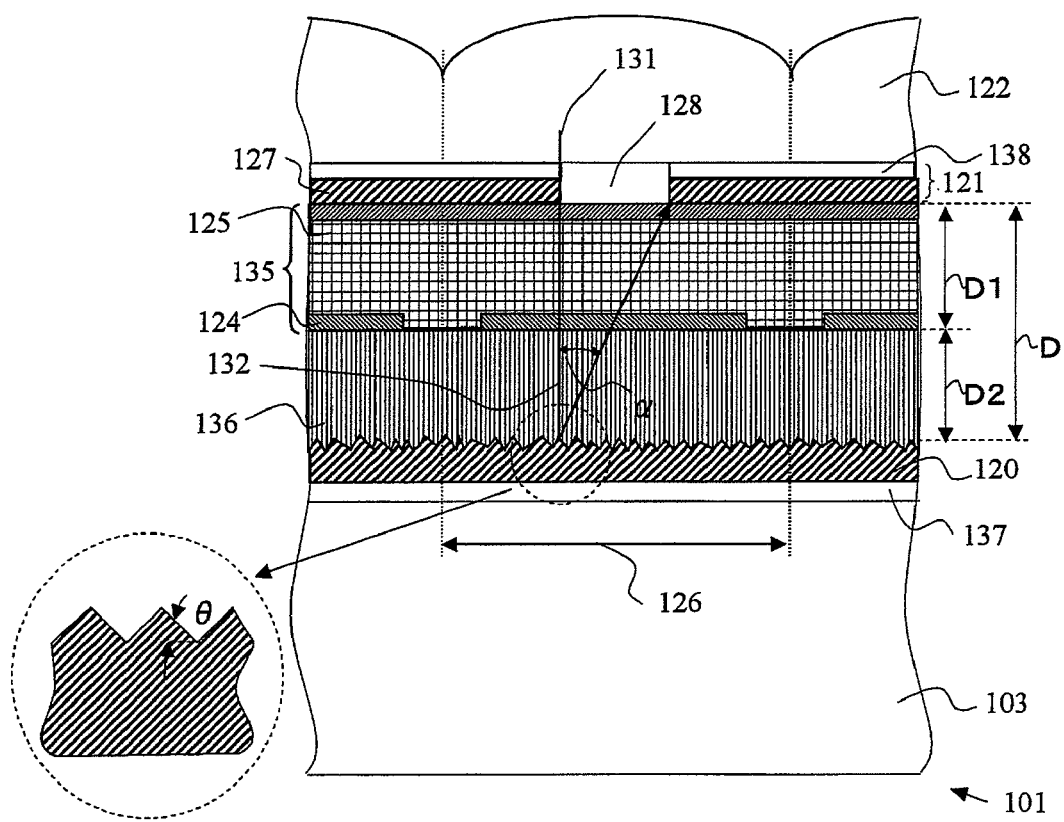
FIG. 7 is a sectional view of the photo-detector for explaining the design of the concavo-convex shape of the reflecting layer 121 in the second embodiment.

The photo-detector of the present invention according to the second embodiment will be explained with reference to FIG. 7. In FIG. 7, the same elements as those of the first embodiment are indicated with the same symbols (the same shall apply to the following drawings).

In the photo-detector of this embodiment, the shape of the second reflecting layer 120 differs from that of the second reflecting layer 120 of the first embodiment. The other configurations are the same as those of the first embodiment. That is, the second reflecting layer 120 of this embodiment has a plurality of convexes and concaves on the reflecting surface as shown in FIG. 7. When it reflects the incident photons 132, it can thereby reflect them with a large amount of horizontal components, in other words, it can reflect them with a large reflection angle. This makes it possible to reflect photons which entered from the light entrance window 128 to the first reflecting layer 121, and therefore the amount of photons to be detected again by the photoelectric conversion film 125 can be increased.

The convexes and concaves of the reflecting surface for efficiently reflecting the photons which entered from the light entrance window 128 to the first reflecting layer 121 will be explained. Here, in order to simplify the explanation, it is assumed that there shall be no refraction of light at interfaces of the layers.

When the photons 132 which entered along the end of the light entrance window 128 are reflected by the concavo-convex surface of the second reflecting layer 120 with a reflection angle larger than the reflection angle represented by $\alpha$ in the drawing, most of the scattered photons can reach the first reflecting layer 121 except for those absorbed by the photoelectric conversion film 125. If the shortest length from the boundary of the light entrance window 128 and the photoelectric conversion element 135 to the peaks of convexes is represented by D, and the width of the light entrance window 128 is represented by W, the relation of the reflection angle $\alpha$, D and W is represented as D·tan $\alpha$=W. Therefore, it can be understood that, in order that most of photons reflected by the second reflecting layer 120 (photons not absorbed) should reach the first reflecting layer 121, the reflection angle $\alpha$ (should satisfy the condition D·tan $\alpha \geq W$.

It can be understood that, in order to obtain such a reflection angle, when the section of the convexes and concaves have triangles having a basic angle $\theta$, the condition D·tan $2\theta \geq W$ should be satisfied. As specific calculation, when the width W of the light entrance window 128 is 20 μm, the thickness D2 of the transparent layer 136 is 100 μm, the thickness D1 of the photoelectric conversion element 135 is 50 nm, and the vertical drop from the peak to the bottom of the convexes and concaves is 200 nm or smaller, $\alpha$ should be 11.3 degrees or larger, and $\theta$ should be 5.7 degrees or larger. Therefore, by forming such convexes and concaves, photons can be more efficiently confined in the element 110 and detected.

The concavo-convex surface of the second reflecting layer 120 can be manufactured by, for example, forming concaves and convexes on the surface of the transparent layer 136 before producing the reflecting layer 120, and then depositing a metal thereon to produce the reflecting layer 120. The concaves and convexes of the transparent layer 136 can be formed by a known technique such as sputtering and microlithography.

In the drawing, a case where the whole surface of the second reflecting layer 120 is made into a concavo-convex surface is shown. However, a structure where concaves and convexes are partially formed, for example, for only a center portion of the element 110 or a portion facing the light entrance window 128 in parallel, and the remaining portion is made into a mirror surface may also be employed. When the whole surface is a concavo-convex surface, although photons which entered around the center of the solid-state imaging element 110 are reflected to the reflecting surface 127 of the reflecting layer 121, photons which entered to a portion other than the center of the solid-state imaging element 110 may be returned to the light entrance window 128 or reflected even to a next solid-state imaging element 110. By providing a concavo-convex surface for only a predetermined portion, such undesirable scattering can be reduced.

Further, the concaves and convexes may be regular concaves and convexes or irregular concaves and convexes.

According to the photo-detector of this embodiment, the same effect as that of the first embodiment can be obtained. Further, the concavo-convex surface of the second reflecting layer 120 enables efficient reciprocation of incident photons not absorbed by the photoelectric conversion film 125 between both the reflecting layers. Furthermore, the photo-detector of this embodiment also has an effect that the transparent layer 136 can provide concaves and convexes which realizes a large reflection angle in addition to the same effect as that of the first embodiment. That is, when there is not the transparent layer 136, concaves and convexes having a vertical drop larger than the thickness of the photoelectric conversion element 135 cannot be provided. However, by providing the transparent layer 136, concaves and convexes of various sizes can be realized. Further, according to the present invention, because the transparent layer 136 is provided, concaves and convexes can be formed on the reflecting layer 120 without forming concaves and convexes on the pixel electrode 124. This prevents possible problems, which would have been caused by formation of concaves and convexes on the pixel electrode 124, such as increase in the dark current, generation of uneven electric field in the photoelectric conversion film 125, generation of trap of electric charge by an energy level produced on the surface of the photoelectric conversion film 125, uneven characteristics and variation thereof among the elements 110, generation of cross-talk between the elements 110.

In addition, this embodiment is not limited to the structure shown in the drawing, either, and various modifications are possible.

Third Embodiment

Figure 8:
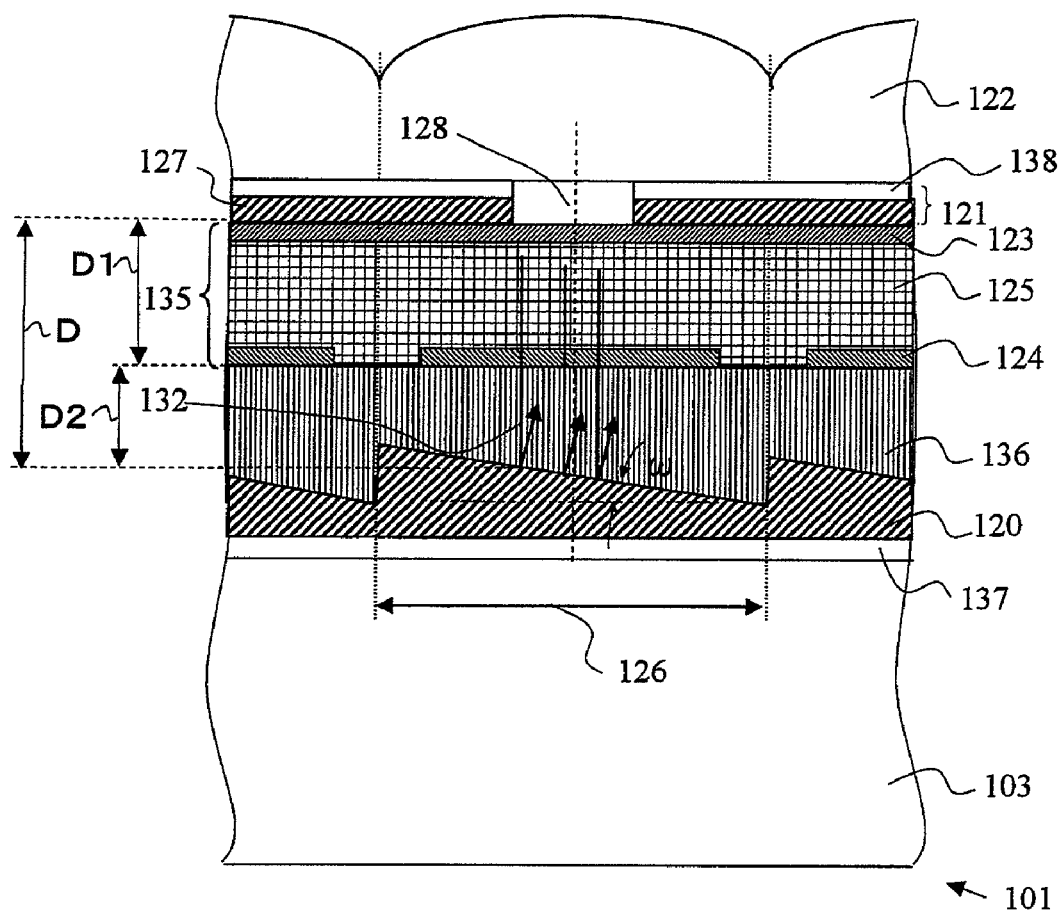
FIG. 8 is a sectional view of the photo-detector of the third embodiment.

The photo-detector of the present invention according to the third embodiment will explained below with reference to FIG. 8.

In the photo-detector of this embodiment, the shape of the second reflecting layer 120 differs from those of the first and second embodiments. The other configurations are the same as those of the first embodiment. That is, as shown in FIG. 8, the reflecting surface of the second reflecting layer 120 of this embodiment inclines. Incident photons are reflected by this reflecting surface to the first reflecting layer 121 on one side of the light entrance window 128.

Inclination of the reflecting surface for efficiently reflecting photons which entered from the light entrance window 128 to the first reflecting layer 121 will be explained. Here, in order to simplify the explanation, it is assumed that there shall be no refraction of light at the interfaces of the layers.

Also in this case, the inclination of the reflecting surface is designed so that most of photons which entered at the end of the light entrance window 128 except for those absorbed by the photoelectric conversion film 125 should reach to the first reflecting layer 121. That is, in FIG. 8, in order that photons which entered into the left end part of the light entrance window 128 should reach the reflecting layer 121 located on the right side of the light entrance window 128, if the shortest length for photons to pass the end of the light entrance window 128 and reach the reflecting surface is represented by D, and the width of the light entrance window 128 is represented by W, the angle of the inclination ω should be determined to satisfy the condition D·tan ω≧W.

As specific calculation, when the width of the light entrance window 128 is 20 μm, the thickness D2 of the transparent layer 136 is 100 μm, and the thickness D1 of the photoelectric conversion element 135 is 50 nm, ω should be 5.7 degrees or larger. For example, when it is intended to realize this structure in the solid-state imaging element 110 having an element width 126 of 100 μm with an angle ω of 6 degrees, a difference in thickness of a thin part and a thick part in the second reflecting layer 120 is required to be about 10.5 μm. For example, if the thickness D2 of the photoelectric conversion element 135 is 50 nm, it is difficult to form such a structure without the transparent layer 136. However, because the transparent layer 136 is provided in the photo-detector of this embodiment, a reflecting surface providing a large ω which enables effective reflection can be realized.

Although the embodiment shown in the drawing is for a case where the reflecting surface inclines only along the direction of the line B in FIG. 1, the surface may have a two-dimensional structure. For example, a structure where the reflecting surface inclines from a corner toward a diagonal corner of the element 110 may also be used.

Fourth Embodiment

Figure 9:
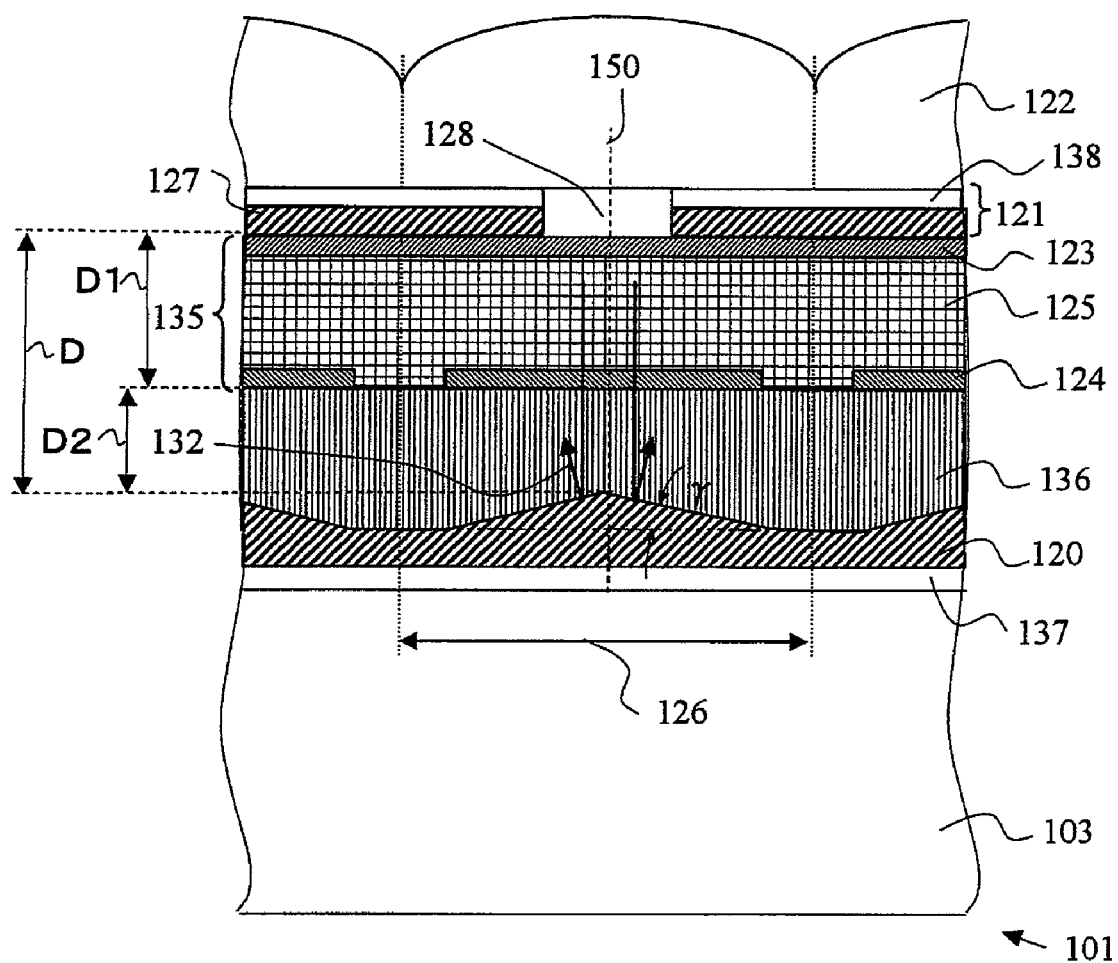
FIG. 9 is a sectional view of the photo-detector of the fourth embodiment.

The photo-detector the present invention according to the fourth embodiment will be explained below with reference to FIG. 9.

In the photo-detector of this embodiment, the structure of the second reflecting layer 120 differs from those of the first and second embodiments. The other configurations are the same as those of the first embodiment. That is, as shown in FIG. 9, the second reflecting layer 120 of this embodiment has such a concavo-convex reflecting surface of which section has isosceles triangles, and the apex of each locates at the element center 150, so that photons should be bilaterally symmetrically reflected from the element center 150. By this reflecting layer 120, photons which entered on the left side from the center of the element 110 are reflected to the reflecting layer 121 on the left side, and photons which entered on the right side from the center of the element 110 are reflected to the reflecting layer 121 on the right side, respectively.

In order that photons reflected by such a reflecting layer 120 should be efficiently reach the reflecting layer 121 without escaping from the light entrance window 128, it is desirable that photons which entered around the center of the element 110 should reach the reflecting layer 127. In such a case, if the basic angle of the isosceles triangle is represented by γ, the shortest length for photons 132 to pass the center of the light entrance window 128 and reach the apex of the isosceles triangle is represented by D, and the width of the light entrance window 128 is represented by W, it is sufficient that γ should satisfy the condition D·tan γ≧(W/2). Thus, it can be understood that, in this embodiment, the shape of the second reflecting layer 120 can realize efficient reflection to the reflecting layer 121 with triangles of a smaller basic angle compared with the second reflecting layer of the second embodiment or the third embodiment.

Also in this embodiment, because the transparent layer 136 is provided, a reflecting surface having a large basic angle γ which enables effective reflection can be realized. That is, if the reflecting surface of the reflecting layer 110 is formed to have a convex having a section in the shape of an isosceles triangle having a base of the same length as the element width 126, when the element width 126 is 100 μm and the basic angle is 3 degrees, for example, a height from the base to the apex is required to be about 2.6 μm. For example, if the thickness D1 of the photoelectric conversion element 135 is 50 nm, it is difficult to realize such a structure without the transparent layer 136, but it can be realized according to this embodiment.

In addition, as an example of modified version of this embodiment, the reflecting surface may also have a concave shape, not a convex shape. Further, the convex or concave shape is not limited to have a section having an isosceles triangle shape, and it may have a section having another type of triangle. In such a case, both the basic angles are desirably such angles that photons should be reflected to the left and right reflecting layers 121, respectively, as is the case mentioned above. Furthermore, the convex or concave shape is not limited to a shape having a section of a triangle shape, but may take various shapes. Further, although the concavo-convex shape is shown in the drawing along the sectional direction of the line A in FIG. 1, this structure may be one-dimensional or two-dimensional structure. In the case of the former, the surface of the reflecting layer has a linear convex or concave shape, and in the case of the latter, it has a convex or concave shape in the form of cone or pyramid.

Fifth Embodiment

Figure 10:
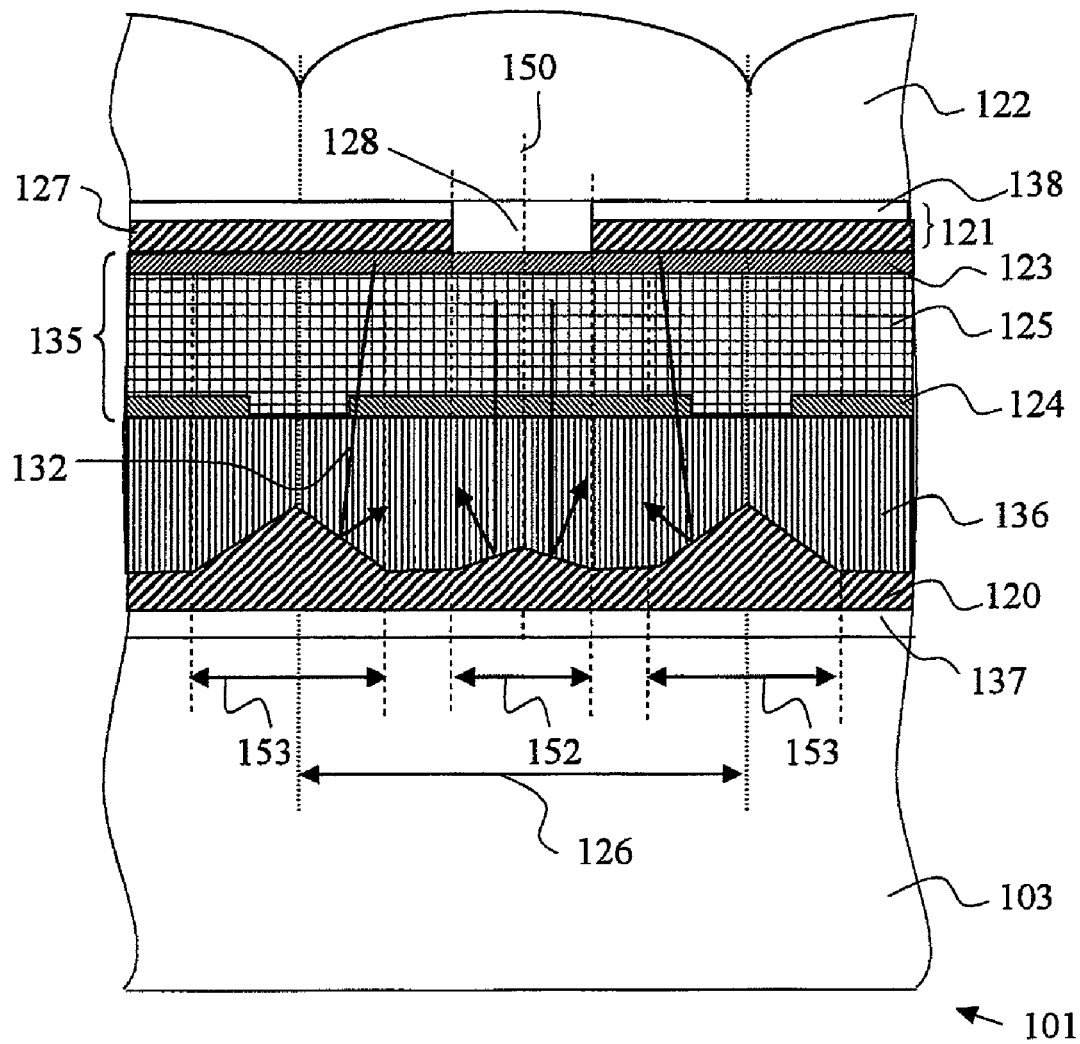
FIG. 10 is a sectional view of the photo-detector of the fifth embodiment.

The photo-detector of this embodiment is characterized in that the reflecting layer 120 has two kinds of convexes functioning differently. That is, as shown in FIG. 10, a convex portion having an isosceles triangle section is formed in an area 152 of the reflecting layer 120 corresponding to the light entrance window 128 as in the fourth embodiment, and slopes are formed at both ends 153 adjacent to other elements 110. When the reflecting layers of adjacent elements are continuous, the slopes at the both ends 153 constitute a convex portion having an isosceles triangle section. The convex having an isosceles triangle section located at the element center reflects photons irradiated on the reflecting layer 120 so that they should go away from the element center 150, but the slope located at the end of the element 110 returns photons to the direction of the element into which the photons entered.

In the photo-detector of this embodiment, cross-talk to the next element 110 can be reduced by the aforementioned structure while suppressing the escape of the photons from the light entrance window 128. The structure shown in FIG. 10 is an example of the structure in which a convex and inclined surface are combined. However, the structure is not limited to this structure, and there may be variously modified versions for returning photons to the direction of the element 110 into which the photons entered. For example, the convex provided on the area 152 may be replace with a concave. Further, the slopes at the both ends 153 may be provided not only for two sides but also for four sides of the element 110.

Sixth Embodiment

Figure 11:
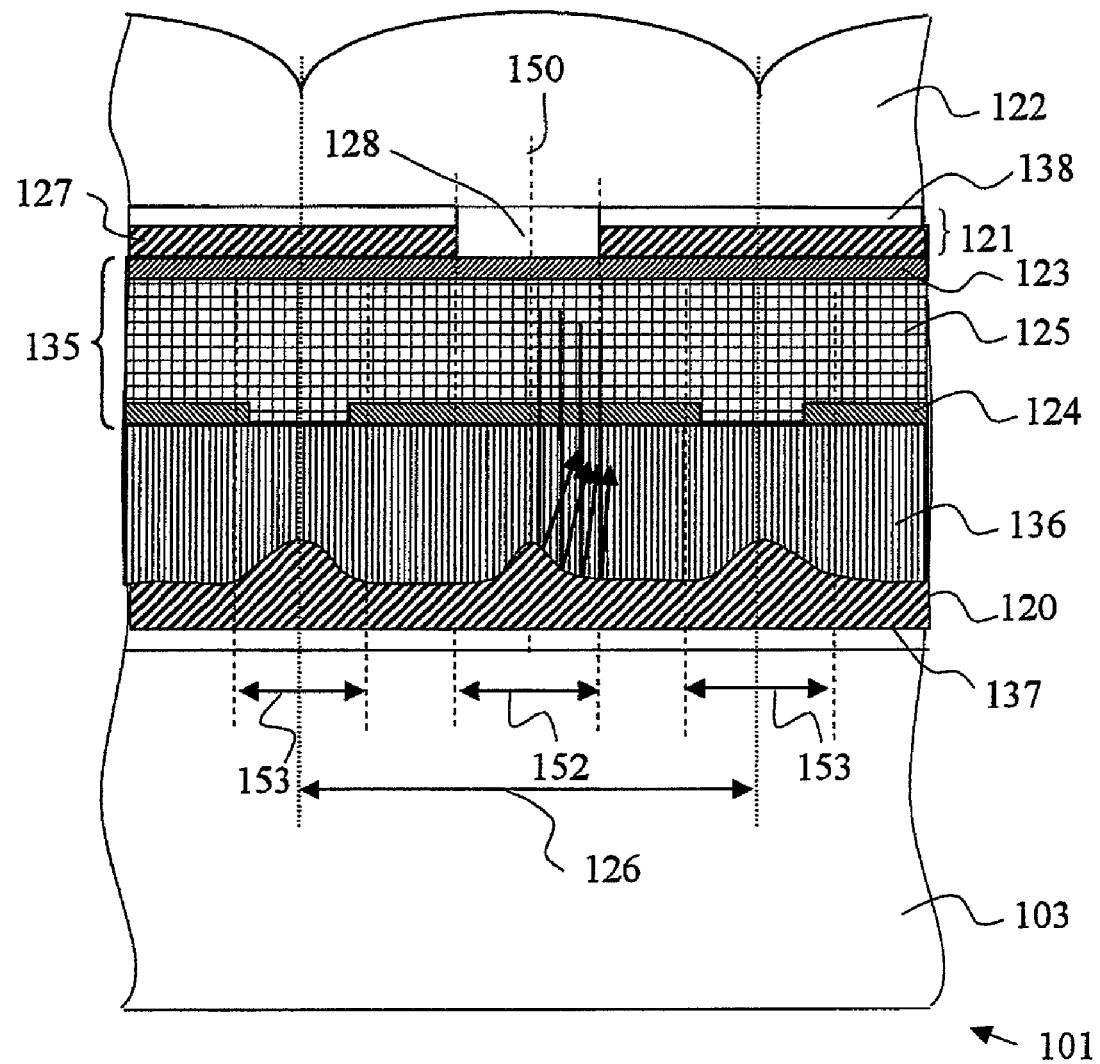
FIG. 11 is a sectional view of the photo-detector of the sixth embodiment

The photo-detector of this embodiment is characterized in that the convex has a curved mirror surface to concentrate reflected photons. An example of such a structure is shown in FIG. 11. In FIG. 11, the convex has a curved mirror surface in the area 152, which makes photons, which entered from the light entrance window 128, have a larger scattering angle as reflection point becomes closer to the element center 150, and the reflected photons reach the reflecting layer 121 with being focused. By such a structure, escape of photons from the light entrance window 128 and cross-talk to the next element 110, which are caused by divergence of photons, can be reduced.

Furthermore, as shown in FIG. 11, the reflection surface has a curved mirror surface also for the area 153 located at the end of the element 110, and reflects even photons reflected by the reflecting layer 121 so that they should be focused. By such a structure, the cross-talk to the next element 110 can further be reduced.

In this embodiment, curved mirror surfaces are provided for both the area 152 and the area 153. However, the present invention is not limited to such a structure, and a curved mirror surface may be provided for either one of them. Furthermore, as the curved surface, various shapes including those of two-dimensional structure are employable.

Various embodiments in which the shape of the reflecting surface of the second reflecting layer is changed have been explained above as embodiments of the photo-detector of the present invention above. However, it is also possible to change the positions and numbers of the members constituting the element. Hereafter, embodiments in which positions and numbers of the members are different from those of the photo-detector of the first embodiment will be explained as the seventh to ninth embodiments.

Seventh Embodiment

The photo-detector of this embodiment is characterized in that the light entrance window 128 is disposed so that it should deviate from the center of the element.

Figure 12:
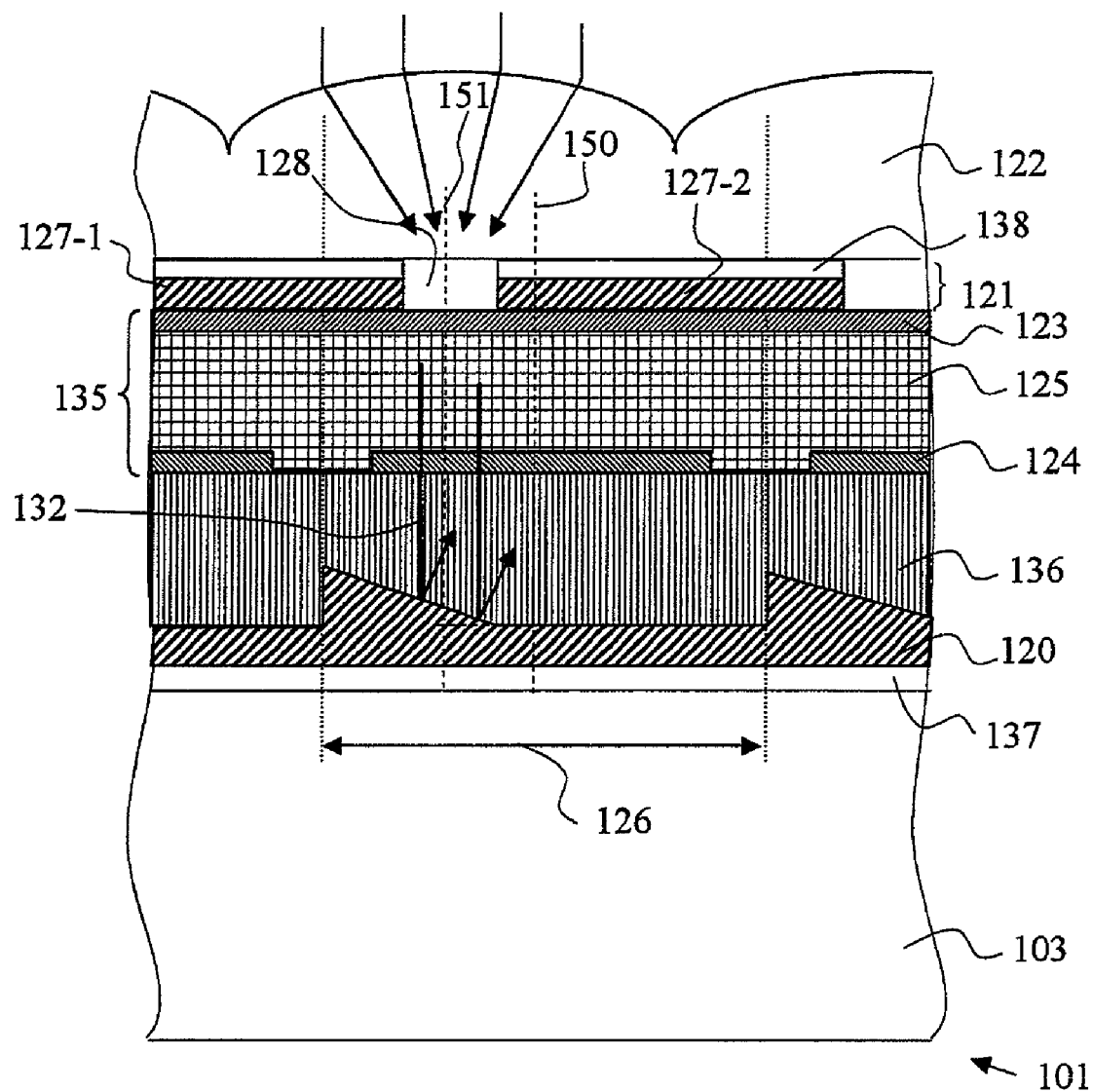
FIG. 12 is a sectional view of the photo-detector of the seventh embodiment.

The structure of the photo-detector 101 of this embodiment will be explained with reference to FIG. 12. In this photo-detector 101, although the center 150 of the element 110 is the center of the photoelectric conversion element 135, the position of the center 151 of the light entrance window 128 differs from the center 150 of the element 110. Corresponding to the shift of the light entrance window 128 from the element center, the microlens 122 is disposed so that the center thereof should correspond to the center 151 of the light entrance window 128 so as to focus photons on the light entrance window 128.

In such a structure, the reflecting layer 120, which reflects photons entering into the element 110, desirably has a structure where the reflecting layer 120 reflects the photons to the reflecting surface 127 of the reflecting layer closer to the center 150 of the element 110, the reflecting surface 127-2 in the element 110 shown in the drawing. Such a structure provides a large space in which photons can reciprocate between the reflecting layer 120 and the reflecting layer 121, and thus reciprocate in the photoelectric conversion element 135, to reduce the cross-talk to the next element 110 and improve the detection efficiency.

For that purpose, inclination is formed only in an area facing the light entrance window 128 for the second reflecting layer 120. This slope continues to the boundary with the adjacent element closer to the center 171 of the light entrance window 128, and the area shaded by the reflecting surface 127-2 is desirably a mirror surface not inclined. This makes it possible to prevent photons which are reflected by the reflecting surface 127 of the reflecting layer 121 and then reach the reflecting layer 120 from being reflected with a large reflection angle to enter into the next element 110. At this time, because the photons reciprocate between the reflecting layer 121 and the reflecting layer 120 with a constant reflection angle, the number of times of reflection is substantially proportional to the distance from the boundary of the light entrance window 128 and the reflecting surface 127-2 to the next element, but amount of photons reciprocating without being detected decreases exponentially to the number of times of reflection. Therefore, it becomes possible to realize improvement in the detection efficiency and reduction of the cross-talk to the next element 110.

Eighth Embodiment

Figure 13:
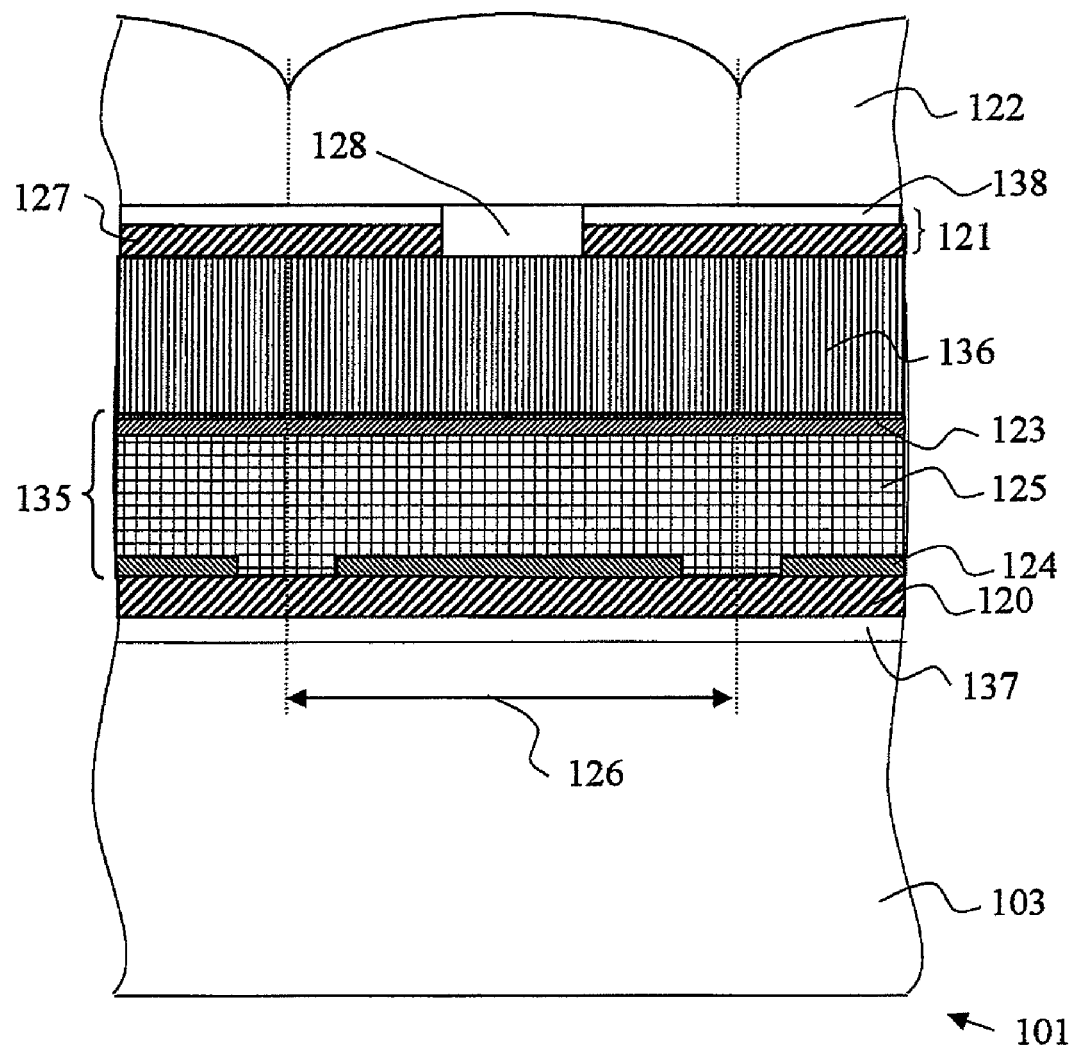
FIG. 13 is a sectional view of the photo-detector of the eighth embodiment.

In the photo-detector of this embodiment, the position of the transparent layer 136 differs from that of the first to seventh embodiments. That is, in this embodiment, as shown in FIG. 13, the transparent layer 136 is disposed between the first reflecting layer 121 and the photoelectric conversion element 135. In this embodiment, the same structures realized for the second reflecting layer in the second to seventh embodiments can be realized also for the first reflecting layer 121 such as the structure where inclination, convex or concave is provided to make photons go away from the light entrance window 128, the structure for returning photons to the element 110 center in a region close to the end of the element 110, the structure for concentrating photons. This makes it possible to reduce escape of photons from the light entrance window 128 and the cross-talk to other elements 110.

Ninth Embodiment

In the photo-detector of this embodiment, a second transparent layer is disposed between the first reflecting layer 121 and the photoelectric conversion element 135 of the first embodiment.

Figure 14:
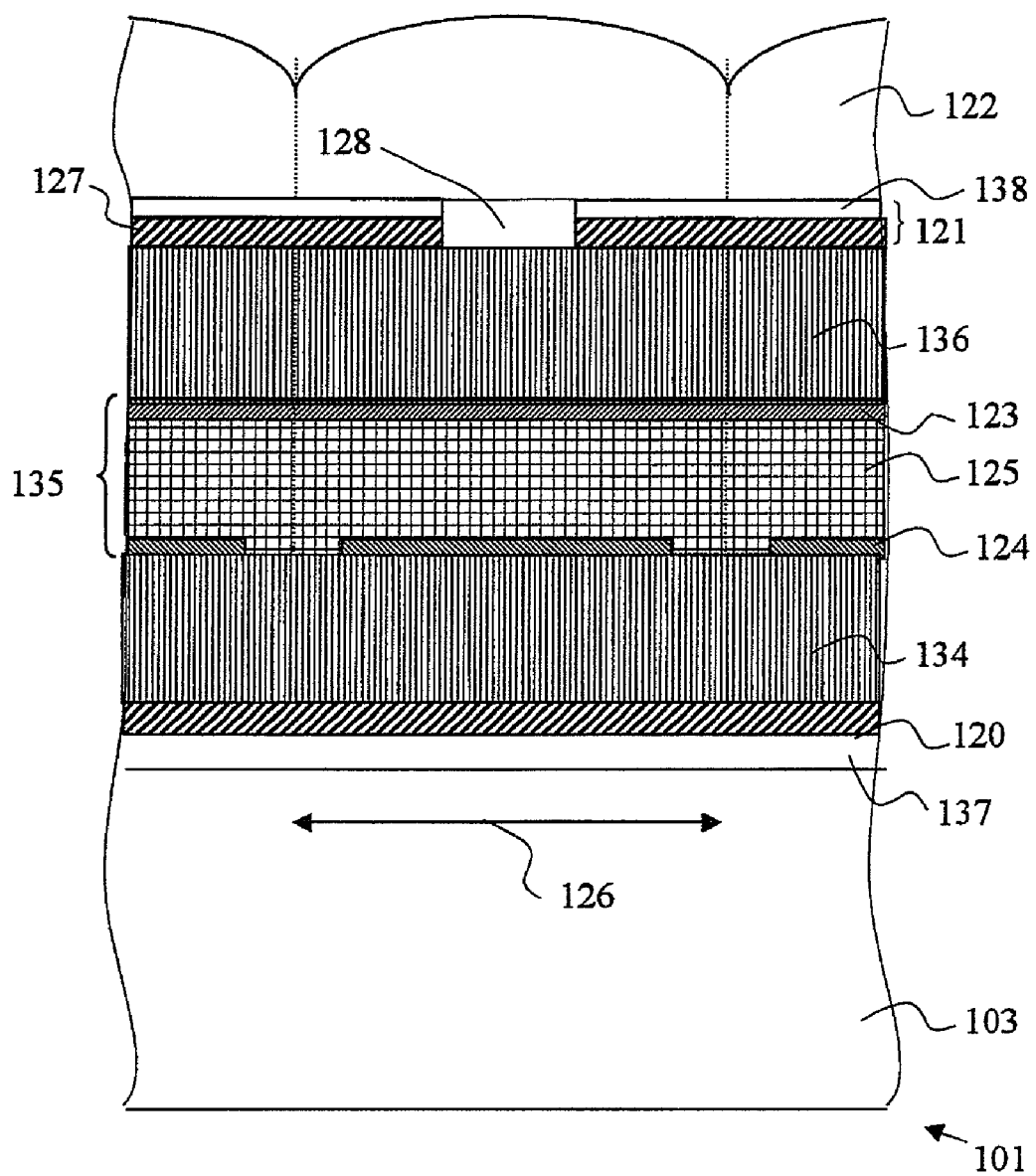
FIG. 14 is a sectional view of the photo-detector of the ninth embodiment.

That is, in the photo-detector of this embodiment, as shown in FIG. 14, a first transparent layer 134 is provided between the reflecting layer 120 and the photoelectric conversion element 135, and a second transparent layer 136 is provided between the reflecting layer 121 and the photoelectric conversion element 135. This embodiment employs a structure where the first and second reflecting layers 121 and 120 sandwich the photoelectric conversion element 135 via the transparent layer respectively, and therefore various shapes and structures can be realized in both the reflecting layer 120 and the reflecting layer 121 without suffering from limitations imposed by the thickness of the photoelectric conversion element 135. Improvement in the detection efficiency and reduction of the escape from the light entrance window 128 and cross-talk to other solid-state imaging elements 110 can be thereby realized.

An embodiment of the solid-state imaging element of the present invention provided with a structure for reducing the cross-talk of photons with adjacent solid-state imaging elements will be explained below.

Tenth Embodiment

Figure 15:
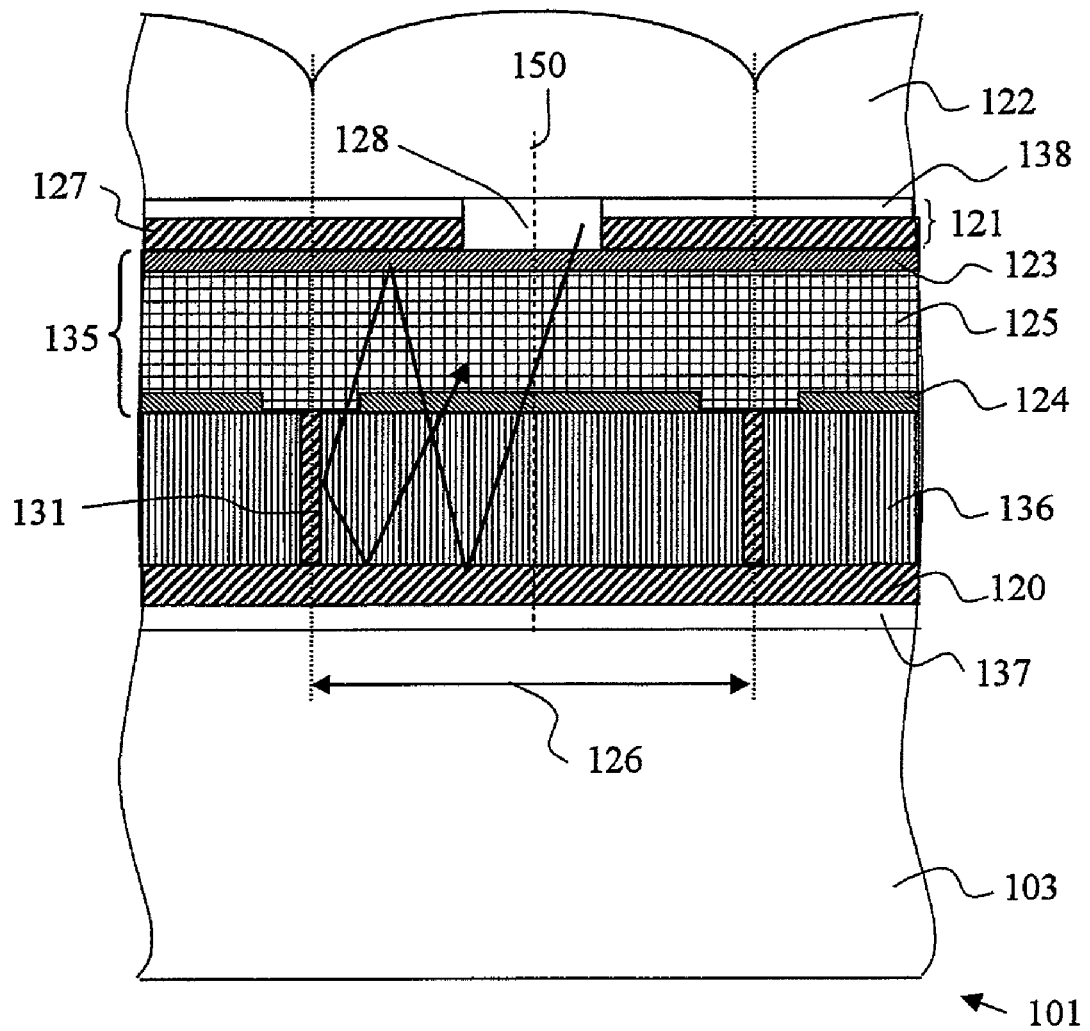
FIG. 15 is a sectional view of the photo-detector of the tenth embodiment.

An example of the photo-detector of this embodiment is shown in FIG. 15.

Although the photo-detector of this embodiment is the same as that of the first embodiment in the configuration that it is provided with the first reflecting layer 121 on the photon incidence side of the photoelectric conversion element 135, and provided with the transparent layer 136 and the second reflecting layer 120 on the opposite side, a shading layer 131 between elements is provided at the boundary of the transparent layer 136 and the adjacent element.

The shading layer 131 between elements desirably shades in such a degree that the photon transmission should be, for example, 20% or less. The cross-talk of photons to the next element 110 can be thereby reduced. Further, the shading layer 131 between elements may have a structure for reflecting photons. In this case, by making the reflection rate 40% or more, for example, photons coming to the end of the element 110 can be reflected to the direction of the element center 150 to improve the detection efficiency. Furthermore, the shading layer 131 between elements may have both the functions for shading and reflection.

Examples of the material of such a shading layer 131 between elements include materials which shade photons, for example, metals such as aluminum and silver, white paints comprising a white pigment or the like in a binder, and a substance which has a refractive index different from that of the photoelectric conversion film 125 and causes reflection due to the difference in the refractive index. As for the production method of the shading layer 131 between elements, it can be manufactured by, for example, a method of forming a film of the material mentioned above on sides of the transparent layer 136 of each element by coating or deposition, a method of forming slots in a glass plate or plastic plate which constitutes the transparent layer, and injecting a material which shades photons such as a white paint into the slots, or the like.

A slot provided between the elements 110 itself may also function as the shading layer 131 between elements. That is, when a space (slot) of air or vacuum is provided as the shading layer 131 between elements, photons are reflected and shaded by a side of the slot. Furthermore, it is also possible to provide a structure of a frosted glass-like profile on the side of the slot by roughening the surface for scattering photons.

Although the shading layer 131 between elements is provided so as to penetrate the transparent layer 136 in the embodiment shown in the drawing, the present invention is not limited to this structure, and it may be provided without such penetration. Furthermore, the layer may be provided for a part of the photoelectric conversion element 135.

Further, in this embodiment, although the shading layers 131 between elements are provided all the spaces between the elements 110, one of the layer may be provided for every two or more elements. Furthermore, although a case where the shading layer 131 between elements is formed along the direction of the sectional line A in FIG. 1 is shown in the drawing, the shading layer 131 between elements may be provided along the direction perpendicular to that direction (direction of the sectional line B in FIG. 1), or may be two-dimensionally provided along both the directions.

Eleventh Embodiment

Figure 16:
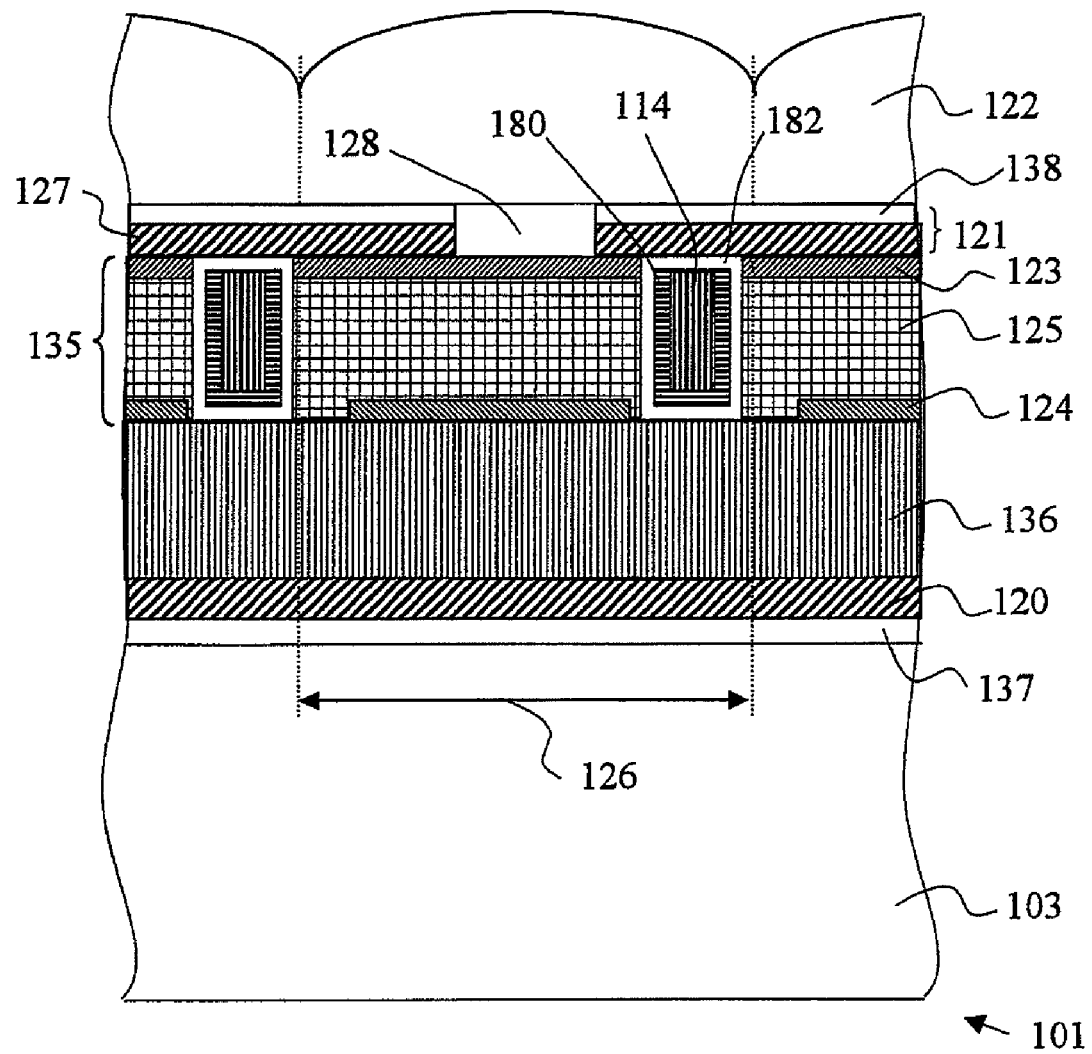
FIG. 16 shows the photo-detector of the eleventh embodiment, and is a sectional view thereof along the sectional line B in FIG. 1.

As the eleventh embodiment, an embodiment of the photo-detector in which a structure where photons do not enter into the switch 114 of the element 110 is realized will be explained below. The photo-detector of this embodiment is shown in FIG. 16. FIG. 16 is a sectional view along the line B in FIG. 1.

As shown in FIG. 16, the switch 114 is disposed at a position shaded by the reflecting surface 127 of the reflecting layer 121, and further has a switch shading layer 180 around it. This switch shading layer 180 is formed with a material which shades photons, for example, a metal such as aluminum or silver, a white paint containing a white pigment in a binder, or the like. When the switch shading layer 180 is formed with a metal, a structure that prevents electric contact such as an insulation layer 182 is provided between the switch shading layer and the switch 114, the photoelectric conversion film 125, the pixel electrode 124, and the common electrode 123. This insulation layer 182 consists of, for example, a metal oxide, silicon oxide, silicon nitride or the like.

The switch shading layer 180 desirably shades photons in such a degree that, for example, photon transmission should be 20% or less. Error signals and noises which are generated due to detection of light by the switch 114 can be thereby suppressed. Further, the switch shading layer 180 may have a structure for reflecting light. In such a case, the reflection rate of the layer is preferably, for example, 40% or more. Photons which come to the end of the element 110 can be thereby reflected to the direction of the element center 150 to improve the detection efficiency. Furthermore, the switch shading layer 180 may have both the functions for shading and reflection.

Figure 17:
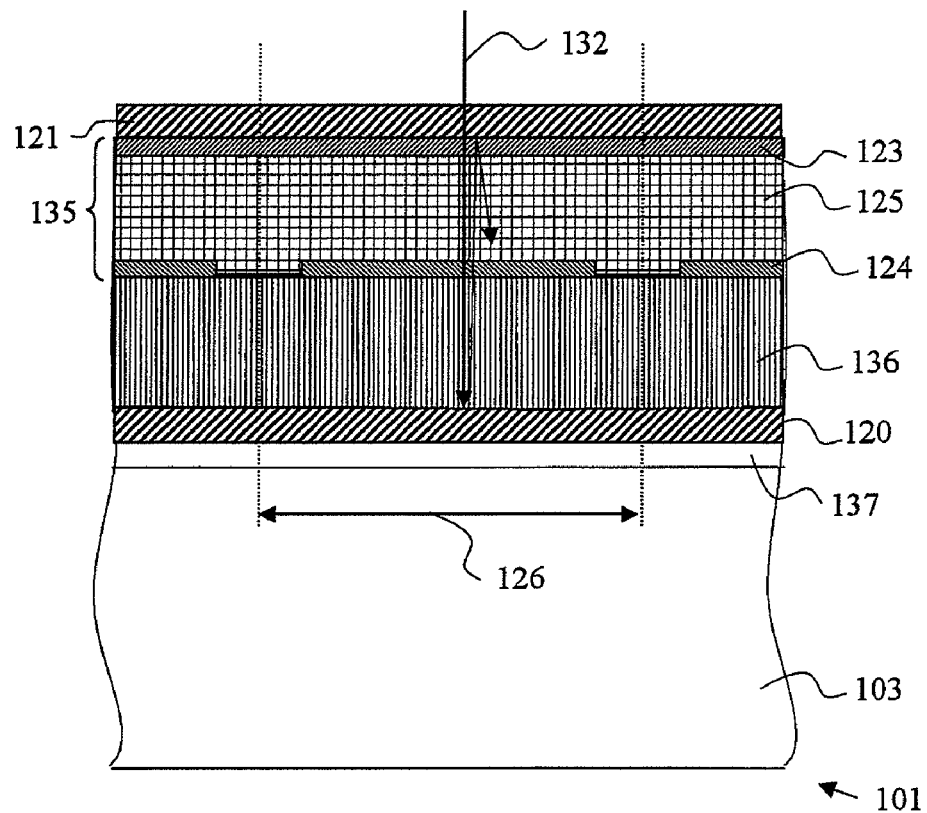
FIG. 17 is a sectional view of the photo-detector of the twelfth embodiment.

Although FIG. 17 illustrates a configuration where the switch shading layer 180 is provided in the photo-detector of the first embodiment as a basic structure, this embodiment can also be applied to the photo-detectors of the second to the tenth embodiments.

Twelfth Embodiment

The photo-detector of this embodiment differs from those of the embodiments explained above in that the reflecting layer 121 does not have a specific light entrance window, and does not have a concentration means which is combined with such a light entrance window. That is, in the photo-detector of this embodiment, as shown in FIG. 17, the reflecting layer 121 consists of a one-way mirror, and transmits incident photons 132 so that the photons penetrate into the photoelectric conversion element 135, but it reflects photons reflected from the reflecting layer 120 so that the photons should go into the photoelectric conversion element 135 again. This one-way mirror is manufactured by, for example, forming a film of chromium, SUS or the like on one surface of a glass plate so thinly that the film should be translucent. A part of incident photons can be thereby confined in the element 110 and detected, and thus it becomes possible to improve the detection efficiency.

Even when the reflecting layer 121 which is a one-way mirror is not provided, reflection occurs at the interface of the photoelectric conversion film 125 and the common electrode 123 or the interface of the common electrode 123 and air or vacuum of the outside due to the difference of refractive index. However, degree of this reflection is not a degree effective for improving the detection efficiency. In order to realize effective detection efficiency with this configuration, the reflecting layer 121 should have a reflection rate of at least 10% or more, and it desirably has a reflection rate of 30% or more.

Furthermore, transmission rate of the one-way mirror is lower than that of glass or the like for the structural reason. However, in order to detect an effective amount of photons, for example, a transmission rate of 20% or more is desirable, and a product of transmission rate and the reflection rate of, for example, 0.05 or more is desirable.

Since processing for providing the light entrance window on the first reflecting layer and processing for providing a concavo-convex or inclined surface of the second reflecting layer are unnecessary in this embodiment, it has an advantage that the manufacture of the photo-detector becomes easy.

The solid-state imaging element of the present invention and various embodiments of the photo-detector which carries it have been explained above. However, the present invention is not limited to the aforementioned embodiments, and various modifications are possible. For example, it is also possible to suitably combine the members explained in the embodiments. Further, it is also possible to omit certain member or members among the total members mentioned in the embodiments.

Hereafter, the personal authentication system of the present invention will be explained. The personal authentication system of the present invention utilizes the photo-detector of the present invention.

Figure 18:
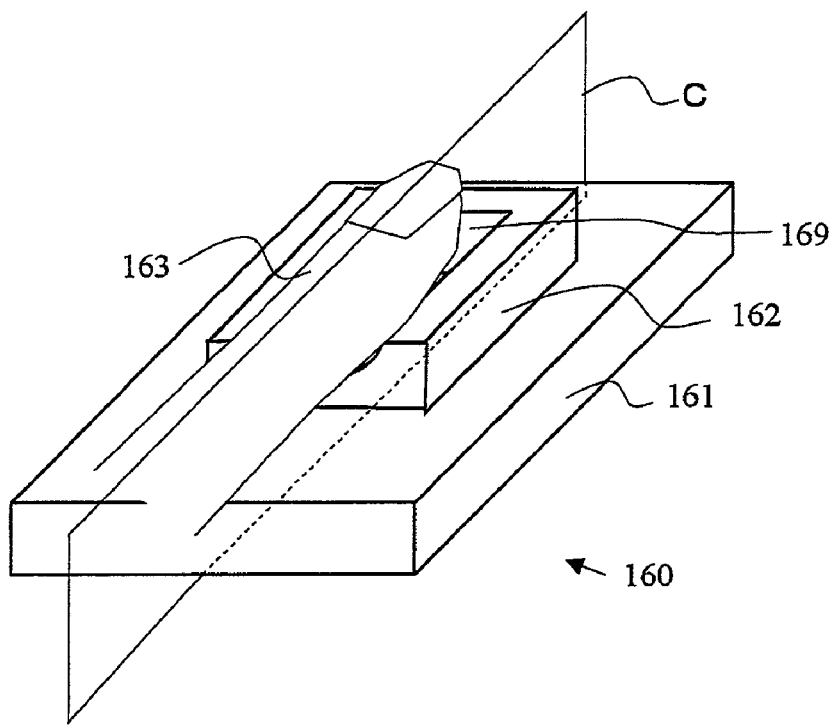
FIG. 18 shows an external view of an embodiment of the personal authentication system of the present invention.
Figure 19:
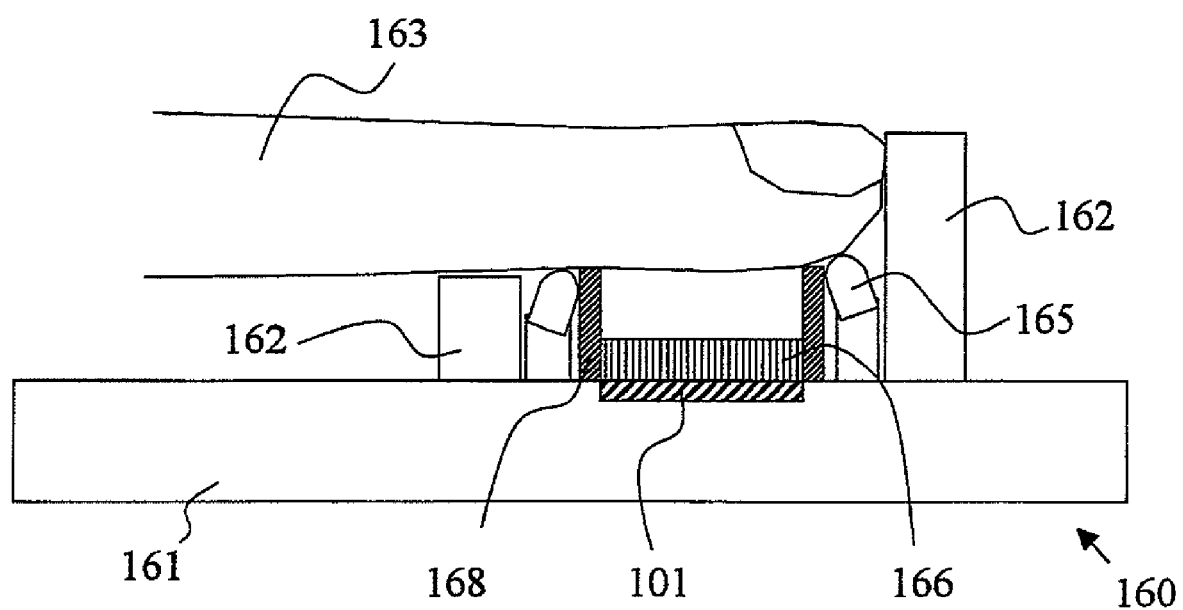
FIG. 19 is a sectional view of the personal authentication system using finger vein pattern of FIG. 18 along the sectional line C.

An embodiment of a personal authentication system using finger vein pattern utilizing the personal authentication system of the present invention will be explained below with reference to FIGS. 18 to 20. FIG. 18 is an external view of the system, and FIG. 19 is a sectional view along the sectional plane C in FIG. 18. This personal authentication system using finger vein pattern 160 is a system for identifying an individual by using a captured finger vein pattern image, and has an external view as shown in FIG. 18 that an image capturing window 169 surrounded by an outer wall 162 is formed on a system package 161.

The outer wall 162 also serves as a stand on which a finger 163 is placed, and prevents external light from entering into a photo-detector 101 disposed in the image capturing window. In the image capturing window 169, a light irradiating means 165 comprising a diode and the photo-detector 101, and a light shading plate 168 for shading light is provided between the light irradiating means 165 and the photo-detector 101. The photo-detector 101 is the photo-detector of the present invention, and for example, any one of the photo-detectors of the first to twelfth embodiments mentioned above is used. As the diode, one which emits near-infrared light which easily enters into the inside of a finger is preferably used. Further, the light irradiating means 165 is provided at a position at which the finger 163 can substantially contact with it. Further, on the photo-detector 101, a collimator 166 is provided. The collimator 166 prevents light from the light irradiating means 165 from directly entering into the photo-detector 101, and eliminates scattered radiation entering into the detector with an angle other than substantially perpendicular to the detector.

Although not shown in the drawings, this system package 161 is connected to, for example, a personal computer (PC) or ATM depending on the use of the personal authentication system using finger vein pattern. Further, in the PC or ATM, a memory in which biological information of objects is registered and stored beforehand, and a processor for performing signal processing for an digital image obtained by the readout circuit of the photo-detector to extract information and comparing the extracted information with the biological information of the individual registered in the memory to perform personal authentication are provided.

Flow of the process for performing personal authentication with such a configuration as mentioned above will be explained with reference to FIG. 20.

First, if the finger 163 is placed on the personal authentication system using finger vein pattern 160 as shown in FIG. 19, the diode 165 irradiates light on the finger. The light irradiated into the finger 163 is absorbed and scattered in the inside of the finger, and a part of it is emitted from the surface. Since absorption by deoxyhemoglobin in blood in veins differs from absorption by other tissues, blood and the like, an image of the veins can be obtained by imaging the light by the photo-detector 101 (Step 200).

The thus obtained image is then sent to the connected PC or computer in ATM, and subjected to image processing therein and used for authentication using finger vein pattern. In the image processing, image cutting 201 is performed first for the captured finger vein image to extract the profile and thereby cut a portion of the finger. Then, this image is subjected to image filtering 202 to prepare an image consisting of spatial frequency components required for a finger vein pattern. This image filtering 202 is, for example, high-pass filtering. Then, position correction 203 is performed to correct difference in angle of the finger. Then, information extraction 204 is performed for this image to obtain only a finger vein image 205 to be used for personal authentication. This processing is, for example, a processing for extracting only an image of finger veins used for personal authentication from the image obtained by the image capturing on the basis of sizes of finger veins and concentrations.

In the personal authentication, authentication 207 is performed for determining whether the extracted finger vein image is the same as the finger vein image 206 registered beforehand. This finger vein image 206 registered beforehand is also an image undergone the same image processing as that mentioned above. Further, depending on the system, a plurality of finger vein images 206 may be registered beforehand. In this authentication 207, it is determined whether the images match or not on the basis of correlation of the images by using, for example, a known pattern recognition technique or the like. In this determination, when the same pattern is retrieved, authentication of a registered user 209 is completed, and when the same pattern is not retrieved, it is determined that the individual is a non-registered user 208. When this personal authentication system using finger vein pattern is used for PC, for example, on the basis of this result, a signal for validating PC is sent to PC, only when the individual is authenticated as a registered user. Further, when this personal authentication system using finger vein pattern is used for ATM, for example, a signal required to enable withdrawing cash is sent to ATM, only when a registered user is authenticated.

According to the personal authentication system using finger vein pattern of this embodiment, use of the photo-detector of the present invention as the photo-detector enables highly precise imaging of finger veins, and as a result, highly precise authentication is attained.

The aforementioned external view and configuration of the personal authentication system using finger vein pattern, processing method, image capturing method and the like are examples thereof, and the present invention is not limited to these. For example, although the light is irradiated upward in the drawing, i.e., from the photo-detector 101 side, in the system shown in the drawing, there may also be a configuration that light is irradiated on the side of the finger, i.e., along the direction perpendicular to the photo-detector 101, or a configuration that light is irradiated downward in the drawing, i.e., light is irradiated on the finger inserted between the photo-detector 101 and the diode 165. Furthermore, although a personal authentication system using finger vein pattern is described in this embodiment, the present invention can of course be applied to a personal authentication system using vein pattern of palm or back of the hand.

Figure 21:
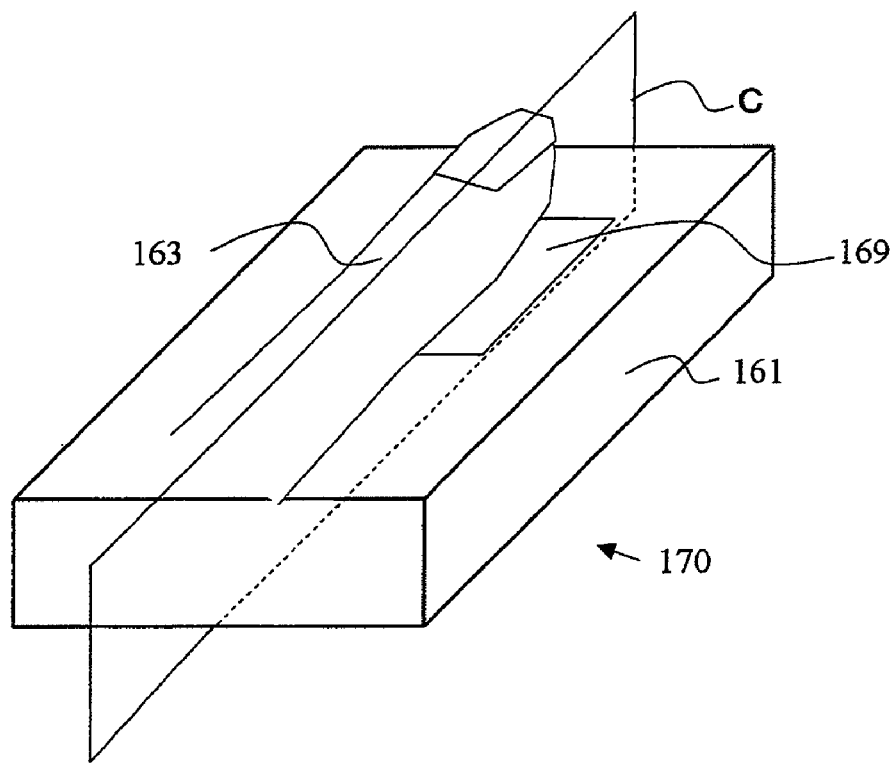
FIG. 21 shows an external view of another embodiment of the personal authentication system of the present invention.
Figure 22:
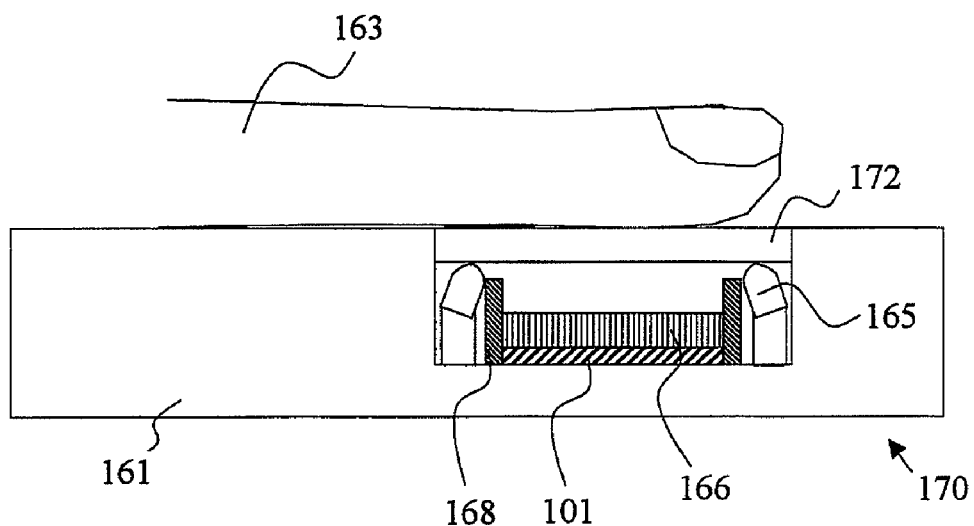
FIG. 22 is a sectional view of the personal authentication system using finger vein pattern of FIG. 21 along the sectional line C.

A personal authentication system using fingerprint is shown in FIGS. 21 and 22 as another embodiment of the personal authentication system of the present invention. Also in this embodiment, it is the same as the personal authentication system using finger vein pattern shown in FIG. 18 in that the photo-detectors of the present invention, for example, any one of the photo-detectors of the first to twelfth embodiments, is used as the photo-detector.

In this personal authentication system using fingerprint 170, a glass plate 172 is provided as the upper surface of the image capturing window 169, and the authentication is performed by holding the finger 163 on the glass plate 172. Inside the image capturing window 169, there are provided the diode 165 for irradiating light on the finger surface, the light shading plate 168 which prevents direct incidence of light, and the collimator 166 which eliminates direct incidence of light and scattered radiation entering with an angle other than an angle substantially perpendicular to the detector. As the light of the light source, for example, visible light or near-infrared light is used.

Figure 20:
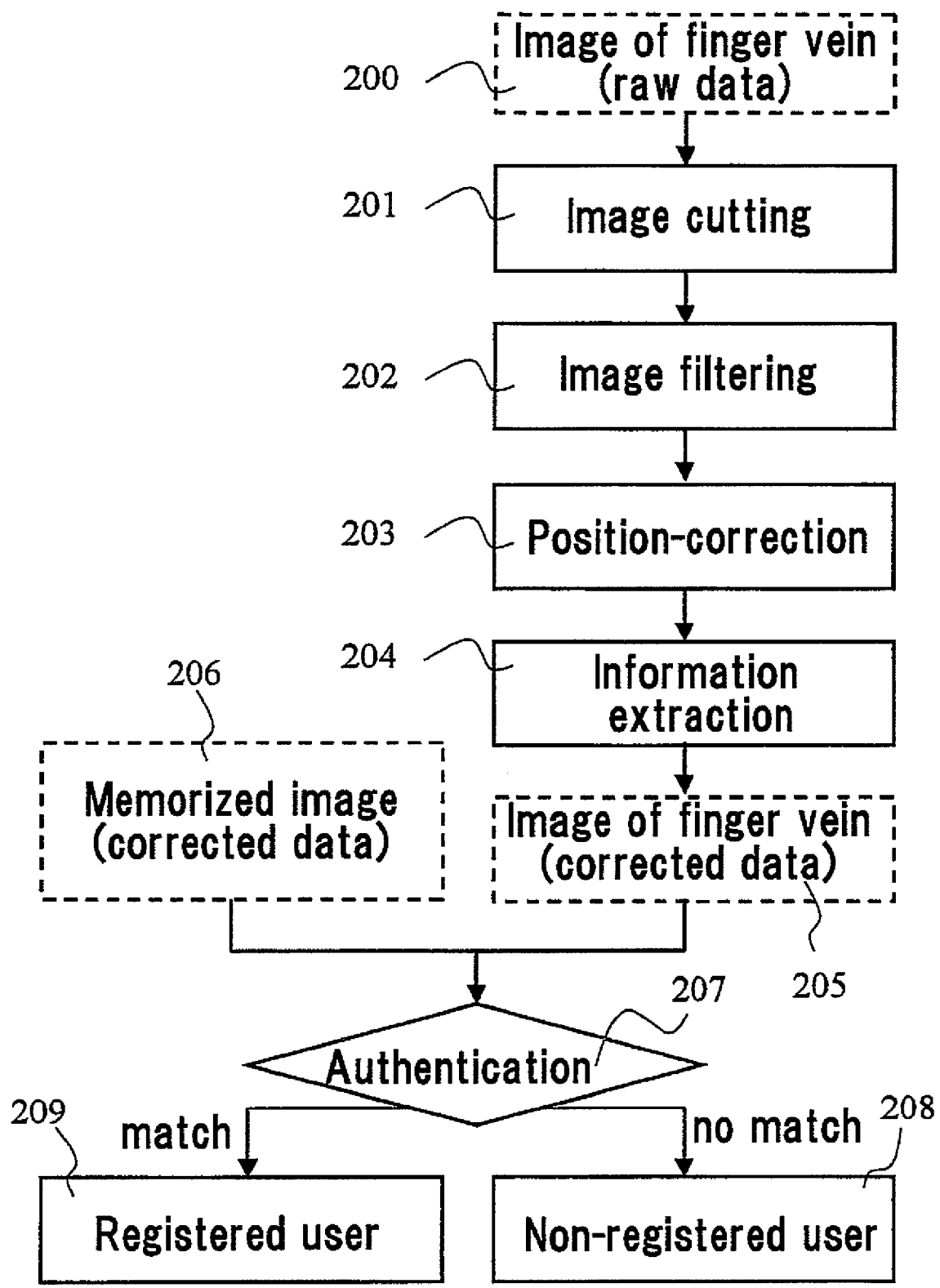
FIG. 20 shows flow of personal authentication performed in the personal authentication system using finger vein pattern of FIG. 18.

Also in this personal authentication system using fingerprint 170, authentication using fingerprint can be realized by, for example, a method similar to the method for authentication using finger vein pattern shown in FIG. 20, and fingerprint on a surface of a finger is imaged by such a method to enable authentication of users. However, this configuration is an example of the personal authentication system using fingerprint, and various other configurations and shapes of the system, mechanisms, processing methods and authentication methods may be possible.

A personal authentication system using finger vein pattern and a personal authentication system using fingerprint have been explained above as embodiments of the personal authentication system of the present invention. However, the present invention is also applicable to other personal authentication systems. For example, the present invention is also applicable to personal authentication systems utilizing iris pattern, various personal authentication systems in which images are obtained by using visible light or infrared rays, further, systems for performing personal authentication by using a plurality of methods, for example, personal authentication systems using finger vein pattern and fingerprint.

Further, the photo-detector of the present invention can be used not only for personal authentication systems, but also for various systems for business, research, education and so forth including systems using a photo-detector in which imaging is performed by using visible light or near-infrared rays for observation or imaging of outer space, celestial bodies, environment, observation or imaging used in the medical field and so forth.

Example

Hereafter, an example performed in order to confirm improvement in detection efficiency obtainable by the photo-detector of the present invention will be explained.

Figure 23:
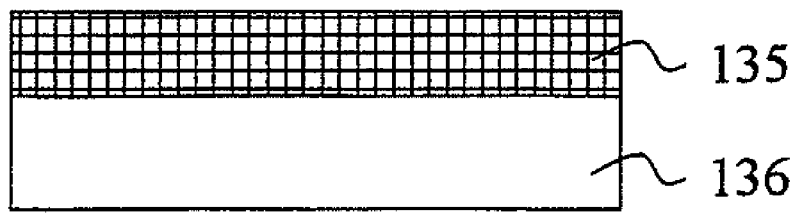
FIG. 23 shows the structures of the photoelectric conversion elements used for the example.
Figure 23:
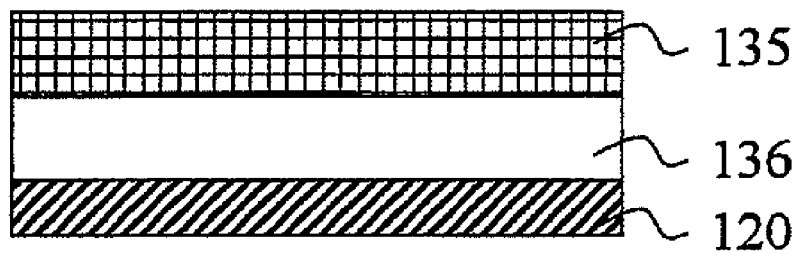
Figure 23:
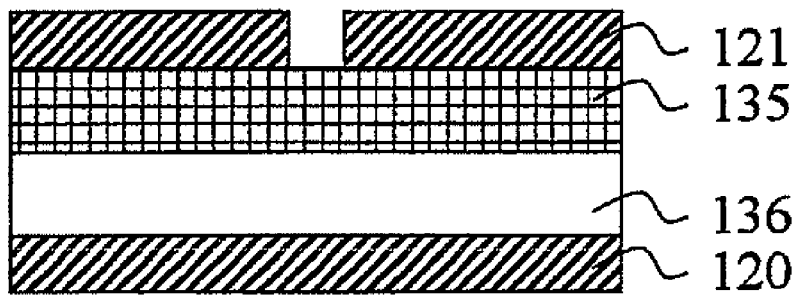

First, photo-detectors of Structure 1 and Structure 2 shown in FIG. 23 were actually manufactured, and basic data were obtained. Used were a glass substrate having a thickness of 500 μm as the substrate 136, polysilicon sensor having a thickness of 50 nm as a photoelectric conversion element 135, and an aluminum foil having a thickness of 50 nm and a reflecting layer of a mirror surface as the reflecting layer 120. Further, as for the light source, light having a wavelength of 500 nm was used. The transmission rate of the glass substrate was 99% or more, and absorption of the light by the substrate 136 was negligible.

First, detection efficiency and transmission rate of the photo-detector of Structure 1 were measured and found to be 0.052 and 0.68, respectively. Then, detection efficiency of the photo-detector of Structure 2 was measured and found to be 0.081, which was 1.56 times the value obtained with Structure 1. Here, if the reflection rate of the reflecting layer 120 is represented by $\chi$, light in an amount of $0.68\chi$ time of the incident light was reflected by the reflecting layer 120 and entered into the photoelectric conversion element 135, and the detection efficiency was thereby increased 0.56 time. Therefore, it is represented as $0.68\chi=0.56$, and the reflection rate $\chi$ is calculated to be 0.82.

Then, by using these results, detection efficiency of the photo-detector of Structure 3 was calculated as follows. Here, in order to ease of examination, inflow and outflow of light between the elements 110 and escape of light from the light entrance window 128 were considered negligible. The case where the inflow and outflow of light between the elements 110 are negligible is a case where the elements 110 are sufficiently large relative to spread of light therein, or a case where there is a structure sufficient for preventing cross-talk between the elements 110. The case where escape of light from the light entrance window 128 is negligible is a case where the light entrance window 128 is sufficiently small relative to the size of the element 110, or a case where the reflecting layer 120 has a structure for reflecting most of light to the reflecting surface 127 of the reflecting layer 121.

First, if the reflection rate of the reflecting layer 121 is assumed to be the same as that of the reflecting layer 120, and the amount of light which entered into the element 110 is taken as 1, the amount of light reflected by the reflecting layer 121 is 0.682×0.822=0.31. Therefore, if light of this amount again goes to the photoelectric conversion element 135 and comes back once, the detection efficiency of the photo-detector increases by 0.081×0.31=0.025. Further, when the reflection by the reflecting layer 120 and the reflecting layer 121 is continued, and light continues to go to the photoelectric conversion element 135 and come back until light is detected, the detection efficiency is represented as $0.081\times(1+0.31+0.31^2+\ldots)=0.117$. Therefore, by providing the reflecting layer 121, the detection efficiency is increased from 0.081 to 0.117, and it can be improved by 44%. As described above, it was confirmed that the structure of the photo-detector 101 was effective for obtaining higher sensitivity of the detector.

However, if most of light is lost by the time that the light reaches and is reflected by the reflecting layer 121 at least for the first time, the effect of the present invention becomes not so significant. Therefore, when the reflection rate of the reflecting layer 120 is represented by R1, the reflection rate of the reflecting layer 121 is represented by R2, and transmission rate of the photoelectric conversion element 135 and the transparent layer 136 for transmission of light is represented by T, it is desirable that T×T×R1×R2 should be 0.1 or larger.

INDUSTRIAL APPLICABILITY

According to the present invention, a photoelectric conversion element showing improved conversion efficiency and a photo-detector showing improved detection efficiency are provided. These photoelectric conversion element and photo-detector can be used as a photo-detector or imaging element built into a personal authentication system and so forth, and a highly precise personal authentication system is thereby provided.

What is claimed is:

1. A solid-state imaging element comprising:
   a photoelectric conversion layer which generates electric charges upon incidence of photons,
   a substantially transparent first electrode which is disposed on the photoelectric conversion layer on the photon incidence side,
   a substantially transparent second electrode which is disposed on the photoelectric conversion layer on the side opposite to the photon incidence side to face the first electrode and detects electric charges generated by the photoelectric conversion layer,
   a first reflecting layer which is disposed in contact with the first electrode on the photon incidence side and has a reflecting surface as the surface in contact with the first electrode,
   a second reflecting layer which is disposed on the second electrode on the side opposite to the photon incidence side and has a reflecting surface as the surface facing the second electrode, and
   a transparent layer or layers disposed between the first electrode and the first reflecting layer and/or between the second electrode and the second reflecting layer.

2. The solid-state imaging element according to claim 1, wherein the first reflecting layer has a light entrance window which transmits incident photons.

3. The solid-state imaging element according to claim 2, wherein the first reflecting layer has a concentration means for concentrating incident photons to the light entrance window on the photon incidence side.

4. The solid-state imaging element according to claim 2, wherein the center of the light entrance window deviates from the center of the solid-state imaging element.

5. The solid-state imaging element according to claim 4, wherein the first reflecting layer has a section separated into a first region and a second region narrower than the first region by the light entrance window, and
   the second reflecting layer has a concavo-convex or inclined surface so as to reflect incident photons mainly to the first region.

6. The solid-state imaging element according to claim 2, wherein the first reflecting layer also serves as one of the electrodes of the photoelectric conversion layer.

7. The solid-state imaging element according to claim 1, wherein the photoelectric conversion layer consists of amorphous silicon or polysilicon.

8. The solid-state imaging element according to claim 1, wherein at least a part of the reflecting surface of the first reflecting layer and/or the second reflecting layer has a concavo-convex or inclined surface.

9. The solid-state imaging element according to claim 8, wherein the concavo-convex surface of the first reflecting layer and/or the second reflecting layer has a sectional shape comprising a plurality of triangles.

10. A solid-state imaging element comprising:
    a photoelectric conversion means which generates an electric signal upon incidence of photons,
    a transparent layer which is substantially transparent for incident photons,
    a first reflecting layer and a second reflecting layer which reflect incident photons,
    wherein
    the photoelectric conversion means is disposed with the transparent layer between the first reflecting layer and the second reflecting layer so that incident photons should be reflected once or more times by each of the first reflecting layer and the second reflecting layer to introduce the photons into the photoelectric conversion means two or more times.

11. The solid-state imaging element according to claim 10, wherein
    the photoelectric conversion means comprises:
    a photoelectric conversion layer which generates electric charges upon incidence of photons,
    a substantially transparent first electrode which is disposed on the photoelectric conversion layer on the photon incidence side, and
    a substantially transparent second electrode which is disposed on the photoelectric conversion layer on the side opposite to the photon incidence side to face the first electrode, the first electrode and the second transparent electrode having a structure for reading amount of electric charge or an electric signal generated by the electric charges,
    the first reflecting layer has a reflecting surface as the surface facing the first electrode, and is disposed on the first electrode on the photon incidence side,
    the second reflecting layer has a reflecting surface as the surface facing the second electrode, and is disposed on the second electrode on the side opposite to the photon incidence side, and
    the transparent layer is disposed between the first electrode and the first reflecting layer and/or between the second electrode and the second reflecting layer.

12. A photo-detector comprising:
a substrate,
an array formed on the substrate and comprising a plurality of solid-state imaging elements, and
a drive circuit for driving a plurality of the solid-state imaging elements, and having a structure in which a second electrode, a photoelectric conversion layer and a first electrode are disposed in this order from the substrate in the plurality of the solid-state imaging elements, and the solid-state imaging elements are electrically connected at the first electrode or the second electrode,
wherein
a second reflecting layer having a reflecting surface as the surface facing the array is formed between the substrate and the second electrode in the array,
a first reflecting layer having a light entrance window which transmits incident photons and a reflecting surface as the surface facing the array is disposed on the first electrode in the array, and
a transparent layer which transmits photons is formed between the first electrode and the first reflecting layer in the array and/or between the second electrode and the second reflecting layer in the array.

13. The photo-detector according to claim 12, wherein the transparent layer of each solid-state imaging element is provided with a third reflecting layer which reflects photons and/or a shading layer which shades photons between the transparent layer and the transparent layer of the adjacent solid-state imaging element.

14. A personal authentication system comprising
a light source which emits light having a wavelength of from visible to near-infrared region,
a photo-detector which detects photons irradiated on an object from the light source and undergone at least one of reflection, transmission and internal scattering,
a read-out circuit which reads signals from the photo-detector to form a digital image of biological information of the object,
a memory means for storing biological information of the object beforehand, and
an authentication means for performing signal processing for the digital image created by the read-out circuit to extract information and comparing the extracted information with the biological information stored by the memory means to attain personal authentication,
wherein the photo-detector is the photo-detector according to claim 12.

15. The personal authentication system according to claim 14, wherein the biological information consists of a vein pattern of at least one of finger, palm of the hand and back of the hand.

16. The personal authentication system according to claim 14, wherein the biological information is a fingerprint.

17. A photo-detector comprising:
a transparent layer;
an array formed on the transparent layer comprising a plurality of solid-state imaging elements; and
a drive circuit, formed on the transparent layer for driving a plurality of the solid-state imaging elements, and comprising a structure in which a second electrode, a photoelectric conversion layer and a first electrode are disposed in this order from the transparent layer side in a plurality of the solid-state imaging elements, wherein the solid-state imaging elements are electrically connected at the first electrode or the second electrode,
wherein the transparent layer is comprised of a material which transmits photons,
a second reflecting layer formed on the transparent layer, said second reflecting layer including a reflecting surface as the surface facing the photoelectric conversion layer on a surface of the transparent layer opposite to the surface of the transparent layer on which the drive circuit is formed; and
a first reflecting layer formed on the first electrode, said first reflecting layer including a reflecting surface as the surface facing the photoelectric conversion layer,
wherein the first reflecting layer or the second reflecting layer is provided with a light entrance window which transmits incident photons to the photoelectric conversion layer.

18. The photo-detector according to claim 17, wherein portions of the transparent layer corresponding to each solid-state imaging element are provided with a third reflecting layer which reflects photons and/or a shading layer which shades photons between the corresponding portion of the transparent layer and the corresponding portion of the transparent layer of the adjacent solid-state imaging element.

19. A personal authentication system comprising
a light source which emits light having a wavelength of visible to near-infrared region,
a photo-detector which detects photons irradiated on an object from the light source and which have undergone at least one of reflection, transmission and internal scattering,
a read-out circuit which reads signals from the photo-detector to form a digital image of biological information of the object,
a memory means for storing biological information of the object beforehand, and
an authentication means for performing signal processing for the digital image created by the read-out circuit to extract information and comparing the extracted information with the biological information stored by the memory means to attain personal authentication,
wherein the photo-detector is the photo-detector according to claim 17.

20. The personal authentication system according to claim 19, wherein the biological information consists of a vein pattern of at least one of finger, palm of the hand and back of the hand.

21. The personal authentication system according to claim 19, wherein the biological information is a fingerprint.

* * * * *